(12) United States Patent
Hao et al.

(10) Patent No.: US 12,535,731 B2
(45) Date of Patent: Jan. 27, 2026

(54) INTEGRALLY FORMED RESIN DIFFUSING COMPONENT, DOE, AND MANUFACTURING METHOD THEREFOR

(71) Applicant: Shanghai North Ocean Photonics Co., Ltd., Shanghai (CN)

(72) Inventors: Fang Hao, Shanghai (CN); He Huang, Shanghai (CN)

(73) Assignee: SHANGHAI NORTH OCEAN PHOTONICS CO., LTD., Shanghai (CN)

(*) Notice: Subject to any disclaimer, the term of this patent is extended or adjusted under 35 U.S.C. 154(b) by 171 days.

(21) Appl. No.: 18/040,768

(22) PCT Filed: Jan. 6, 2021

(86) PCT No.: PCT/CN2021/070478
§ 371 (c)(1),
(2) Date: Feb. 6, 2023

(87) PCT Pub. No.: WO2022/027925
PCT Pub. Date: Feb. 10, 2022

(65) Prior Publication Data
US 2023/0373137 A1    Nov. 23, 2023

(30) Foreign Application Priority Data

Aug. 5, 2020   (CN) .......................... 202010776648.3
Aug. 17, 2020  (CN) .......................... 202010826114.7

(51) Int. Cl.
G03F 7/00     (2006.01)
B29C 59/02    (2006.01)
B29L 11/00    (2006.01)

(52) U.S. Cl.
CPC ............ *G03F 7/0002* (2013.01); *B29C 59/02* (2013.01); *B29C 2059/023* (2013.01); *B29L 2011/00* (2013.01)

(58) Field of Classification Search
CPC .................. G03F 7/0002; B29C 59/02; B29C 2059/023; B29L 2011/00; G02B 5/0226
See application file for complete search history.

(56) References Cited

U.S. PATENT DOCUMENTS

2003/0124435 A1* 7/2003 Rich ..................... B29C 59/046
430/1
2003/0161044 A1   8/2003 Tokoyoda
(Continued)

FOREIGN PATENT DOCUMENTS

CN    101737707 A  *  6/2010
CN    102036797 A     4/2011
(Continued)

OTHER PUBLICATIONS

International Search Report issued in related Application Serial No. PCT/CN2021/070478 on May 11, 2021.
(Continued)

*Primary Examiner* — Jerzi H Moreno Hernandez
(74) *Attorney, Agent, or Firm* — Mark H. Whittenberger; Holland & Knight LLP

(57) ABSTRACT

An integrally formed resin diffusing component, a diffractive optical element (DOE), and a manufacturing method thereof. A resin material in a liquid is spread between a supporting plate and a mold of a manufacturing apparatus, pressed, and light-cured, thus producing the light-cured resin diffusing component or the DOE. The diffusing component or the DOE is integrally formed, the phenomenon of delami-
(Continued)

nation is prevented from occurring, and the need for high-temperature injection molding and cooled forming is obviated.

14 Claims, 13 Drawing Sheets

(56) References Cited

U.S. PATENT DOCUMENTS

| | | | | |
|---|---|---|---|---|
| 2004/0219461 | A1* | 11/2004 | Chung | G03F 7/0002 430/311 |
| 2008/0225394 | A1* | 9/2008 | Lin | G02B 5/0231 359/599 |
| 2009/0243126 | A1 | 10/2009 | Washiya et al. | |
| 2011/0031650 | A1* | 2/2011 | McMackin | G03F 7/0002 264/293 |
| 2014/0010994 | A1* | 1/2014 | Choi | G03F 7/0002 428/156 |
| 2014/0061975 | A1 | 3/2014 | Cho et al. | |
| 2014/0367874 | A1* | 12/2014 | Yamamoto | G03F 7/0002 264/293 |
| 2020/0341368 | A1* | 10/2020 | Yamashita | G03F 7/0002 |

FOREIGN PATENT DOCUMENTS

| | | |
|---|---|---|
| CN | 102272887 A | 12/2011 |
| CN | 106324716 A | 1/2017 |
| CN | 110483700 A | 11/2019 |
| CN | 110869819 A | 3/2020 |
| CN | 111169056 A | 5/2020 |
| CN | 111399096 A | 7/2020 |
| CN | 111730792 A | 10/2020 |
| JP | H07237229 A | 9/1995 |
| JP | 2004341244 A | 12/2004 |
| JP | 2015-106670 A | 6/2015 |
| JP | 201506670 A | 6/2015 |
| WO | 2022/027925 A1 | 2/2022 |

OTHER PUBLICATIONS

Notice of the First Review Opinion issued in Chinese Patent Application No. 202010826114.7 on Mar. 20, 2025.
International Search Report issued in Chinese Patent Application No. 2020108261147 on Mar. 14, 2025.

* cited by examiner

INTEGRALLY FORMED RESIN DIFFUSING COMPONENT, DOE, AND MANUFACTURING METHOD THEREFOR

FIELD

The present invention relates to the field of optics, and further to an integrally formed resin diffusing component and a manufacturing method thereof.

BACKGROUND

Diffusing components such as diffusers are mainly used to modulate the light beam emitted by the light source to form a specific homogenous light field within a required field viewing angle range. Currently, diffusing components are widely used in electronic product field such as camera modules such as TOF camera modules, depth cameras, 3D imaging, face recognition, smart homes, robots, drones, AR/VR, and autonomous driving.

There are mainly two types of existing diffusing components. As shown in FIG. 1A which is a schematic structural diagram of a first type of diffusing component 100A in the conventional technology, the diffusing component 100A includes a glass substrate 10A, an adhesion-promoting layer 20A and a microlens layer 30A arranged in multiple layers, specifically, the adhesion-promoting layer 20A is disposed on the surface of the glass substrate 10A, and the surface of the adhesion-promoting layer 20A is imprinted by nanoimprinting with a resin layer having a micro-nano structure, to form the microlens layer 30A, that is, the microlens layer 30A is made of a resin material. Since the resin material and the glass material are not materials of the same type of substance, there is an issue that the bonding force between the two layers of materials is not stable, which may cause the microlens layer 30A to come off, thereby adversely affecting the optical properties. For example, after the electronic product is subjected to a thermal shock test, the diffusing component 100A may delaminate with a certain probability, therefore, the performance of the electronic product may be adversely affected. In addition, due to the fragility of the glass material of the glass substrate 10A, in some specific application scenarios, in order to protect the safety of human eyes, it is necessary to add a sensor for detecting the glass breakage of the diffusing component 100A in the electronic product, resulting in an increase in the cost of the electronic product.

FIG. 1B is a schematic structural diagram of a second diffusing component 100B in the conventional technology. The diffusing component 100B adopts a conventional injection molding process to integrally form a microlens layer 20B on the surface of a high-temperature resin material substrate 10B. Generally, the diffusing component 100B uses a thermoplastic material as an injection molding raw material, such as a molten resin material, specifically, the molten resin material flows in a mold with a surface microstructure, and then is cooled to form the diffusing component 100B. However, since the molten resin material has a poor fluidity, and in the process of its flowing in the mold, the temperature gradually drops, and the molten resin material is gradually solidified, which makes it difficult to form the diffusing component 100B, especially for the diffusing component 100B of a larger size, due to the increased flow distance of the molten resin material, it is more difficult to form the diffusing component 100B with a larger size. In addition, since the surface microstructure of the mold has some holes of specific size, air is likely to remain in the holes in the process of injection molding, resulting in increased difficulty in injection molding and poor replication ability, especially for injection molding the diffusing component 100B with a finer structure, when the injection molding process is more difficult, the reproducibility is worse. Furthermore, in the process of injection molding of the diffusing component 100B, the molten resin material tends to shrink and shrink unevenly in the process of being cooled, and in the process of being cooled and solidified, since the phenomena that the preset shape cannot be maintained due to insufficient pressure so that the difference between the cooled shape and the designed shape is large, etc., the optical properties of the diffusing component 100B are adversely affected accordingly, so that the electronic products applying the diffusing component 100B cannot obtain expected performance.

Furthermore, the conventional diffusing component is prone to experiencing phenomena such as material yellowing, poor transmittance, the material being pulverized and brittle, and great change of optical properties after the reliability tests such as thermal shock, reflow soldering, high temperature and high humidity, and drop tests that common electronic products must pass.

As well known, the current DOE (diffractive optical element) is applicable to optical sensing elements in augmented reality, mixed reality, virtual reality, and automotive, consumer electronics and commercial applications. The conventional manufacturing method of DOE is generally to imprint a layer of resin layer with micro-nano structure on the surface of the glass substrate by the nano-imprinting method; or the DOE is injection molded with thermoplastic material as the raw material by conventional injection molding process.

For example, as shown in FIG. 15A, in order to form a resin layer micro-nanostructure on glass by nanoimprinting, specifically, to form a resin layer microlens 12P by imprinting on a glass substrate 11P, an adhesion-promoting layer 13P is provided between the glass substrate 11P and the resin layer microlens 12P. However, this technology has some disadvantages. Since the glass substrate 11P and the resin layer microlens 12P are not of the same kind of material, the bonding force between the two layers of materials is unstable, which may cause the resin layer microlens 12P to come off, therefore, the optical properties will be adversely affected. Although the adhesion-promoting layer 13P is used in the conventional technology to enhance the bonding reliability between the glass substrate 11P and the resin layer microlens 12P, after thermal shock tests necessary for common consumer electronics, it will be found that delamination of two layers of materials may still occur with a certain probability. Furthermore, due to the fragile nature of glass, considering the human eye safety risk in some application scenarios, it is necessary to be able to identify glass breakage and add corresponding sensors, so the cost of modules and end-user products will greatly increase.

As shown in FIG. 15B, in order to utilize a conventional injection molding process, thermoplastic materials are used as raw materials to integrally form a high-temperature non-glass material substrate 21P and a micro-nano structure 22P by injection molding. The biggest disadvantage of this technology is the poor fluidity of thermoplastic materials, which leads to a significant issues in the replication of the micro-nano structure 22P, and the finer the structure, the more difficult the injection molding and the poorer the replication ability. Furthermore, the technology of injection molding micro-nano structure further has the following issues: the temperature of thermoplastic material in the molten state drops gradually when thermoplastic material in the molten state flows in the mold, resulting in difficulty in forming; there is often residual air in the microstructure on the surface of the mold, especially in the deep holes; shrinkage in the cooling process and shrinkage inhomogeneity; insufficient holding pressure during cooling and curing;

after the material is molded at high temperature, the shape after cooling is quite different from the design, it is easier to compensate for the mold structure design of the two-dimensional structure of the front end, and there are great difficulties in the compensation for the mold structure design of the three-dimensional shape of the front end.

To sum up, the conventional DOE manufacturing method results in poor stability of the material, and cannot pass the reliability tests that common electronic consumer products must pass. Major issues often occur, for example, after reliability tests such as reflow soldering, high temperature and high humidity and drop tests, issues are apt to occur such as poor transmittance after yellowing of the material, pulverization and brittleness of the material, and large changes in optical properties.

SUMMARY

One advantage of the present invention is the provision of an integrally formed resin diffusing component and a manufacturing method thereof, the diffusing component is manufactured in an imprinting manner without the need for high temperature injection molding and cooling, so the energy consumption is lower and reliability is higher.

Another advantage of the present invention is the provision of an integrally formed resin diffusing component and a manufacturing method thereof, where the diffusing component is integrally formed and delamination may not occur in it, and the diffusing component is of a resin material, which has good toughness and is not apt to brake and does not need to be provided with a sensor for detecting the breakage in an electronic product, such as a camera module, to which the diffusing component is applied, thereby reducing the cost of the electronic product.

Another advantage of the present invention is the provision of an integrally formed resin diffusing component and a manufacturing method thereof, the diffusing component is integrally formed by using a light-curable liquid resin material. The diffusing component, after reliability tests, such as thermal shock, reflow soldering, high temperature and high humidity, and drop test, that common electronic products must pass, is not apt to cause phenomena of yellowing of the material, and the material being pulverized and fragile, and can still ensure reliable transmittance and optical properties and the like.

Another advantage of the present invention is the provision of an integrally formed resin diffusing component and a manufacturing method thereof, compared with a conventional injection molded diffusing component, the diffusing component according to the present invention is integrally formed by imprinting, and has a high replication capability and a strong structure restoration capability.

Another advantage of the present invention is the provision of an integrally formed resin diffusing component and a manufacturing method thereof, the diffusing component, in the manufacturing process, does not require the use of a high temperature and a cooling and curing process, has a small coefficient of thermal expansion, a low energy consumption, and there is a small difference between the configuration of the finally formed diffusing component and the design configuration.

Another advantage of the present invention is the provision of an integrally formed resin diffusing component and a manufacturing method thereof, where the diffusing component is capable of preventing light from generating interference fringes when the light propagates spatially through the diffusing component, which is advantageous for providing a more homogenous light field.

Another advantage of the present invention is the provision of an integrally formed resin diffusing component and a manufacturing method thereof, by which, the diffusing components of different thicknesses can be manufactured.

Another advantage of the present invention is the provision of an integrally formed resin diffusing component and a manufacturing method thereof, with a low cost, good compatibility and simple manufacturing method.

Another advantage of the present invention is the provision of a resin DOE and its manufacturing method and manufacturing apparatus, which can address the issue of delamination of substances by integrated nano-imprinting. In other words, the present invention completely addresses the issue of delamination of the glass substrate and the resin layer micro-nano structure in the conventional DOE product.

Another advantage of the present invention is that it provides a resin DOE and its manufacturing method and manufacturing apparatus, in an embodiment of the present invention, the material for imprinting the DOE itself is an integral resin material, so that the resin DOE has advantages such as a high tenacity and non-fragility.

Another advantage of the present invention is that it provides a resin DOE and its manufacturing method and manufacturing apparatus, in an embodiment of the present invention, replication of the micro-nano structure can be achieved by means of nano-imprinting, and the structure restoration capability is strong.

Another advantage of the present invention is that it provides a resin DOE and its manufacturing method and manufacturing apparatus, in an embodiment of the present invention, the manufacturing apparatus of the resin DOE does not use a high temperature during the imprinting process, so that thermal expansion caused is small and the difference from the structural design is small. Further, the manufacturing apparatus of the resin DOE does not use a high temperature, and energy consumption in the manufacturing process is low.

Another advantage of the present invention is that it provides a resin DOE and its manufacturing method and manufacturing apparatus, in an embodiment of the present invention, the manufacturing method of the resin DOE uses integrally forming and imprinting technique which is compatible with conventional or original nano-imprinting technique, has good forward and backward compatibility, and does not increase additional cost.

Another advantage of the present invention is that it provides a resin DOE and its manufacturing method and manufacturing apparatus, in an embodiment of the present invention, the overall cost of the material used by the resin DOE is lower than the cost of imprinting on glass.

Another advantage of the present invention is that it provides a resin DOE and its manufacturing method and manufacturing apparatus, in an embodiment of the present invention, since the resin DOE does not break like glass, when the resin DOE is used as the optical device in the module, no additional sensing means for sensing breakage is required in the module, thus reducing the cost of the module end and end-user products.

Another advantage of the present invention is that it provides a resin DOE and its manufacturing method and manufacturing apparatus, in an embodiment of the present invention, the resin DOE itself is a light-curable resin adhesive used for nano-imprinting. After practical reliability tests of the material, such as thermal shock, high temperature and high humidity, reflow soldering, micro-drop, it is found that the effects of the light-curable resin adhesive are all equivalent to the effects of the resin product imprinted on glass.

Another advantage of the present invention is that it provides a resin DOE and its manufacturing method and manufacturing apparatus, in which, no precise components and complex structures are required, and its manufacturing process is simple and cost is low.

Another advantage of the present invention is that it provides a resin DOE and its manufacturing method and manufacturing apparatus, in order to achieve the above advantage, no complex structure is required in the present invention. Therefore, the present invention successfully and effectively provides a solution, not only providing a resin DOE and its manufacturing method and manufacturing apparatus, but also increasing the practicality and reliability of the resin DOE and its manufacturing method and manufacturing apparatus.

In one aspect of the present invention, a manufacturing method for the diffusing component of an integrally formed resin diffusing component is further provided according to the present invention, the method includes:

step A, arranging a preset amount of a light-curable resin material in a liquid state on at least one flat supporting surface;

step B, relatively reducing a spacing between a mold and the flat supporting surface until reaching a preset distance, where the mold has at least one microstructured surface for forming a microlens layer of the diffusing component, where the resin material is located between the microstructured surface and the flat supporting surface, and at the preset distance, the liquid resin material is spread between the microstructured surface and the flat supporting surface and has a certain spread area, where the microstructured surface of the mold is imprinted on the surface of the resin material to form the microlens layer; and step C, performing a light-curing treatment on the resin material in a liquid state to obtain the light-cured resin material as the diffusing component.

In an embodiment, in the manufacturing method for the diffusing component, in the step B, the mold is kept relatively parallel to the flat supporting surface.

In an embodiment, in the manufacturing method for the diffusing component, the step B includes:

step B1, relatively reducing a spacing between the mold and the flat supporting surface until a position is reached in which the microstructured surface of the mold contacts the resin material; and step B2, continuing to relatively reduce the spacing between the mold and the flat supporting surface until the preset distance is reached, where the liquid resin material gradually spreads between the microstructured surface and the flat supporting surface, where in the step B1 and the step B2, the mold is always kept relatively parallel to the flat supporting surface.

In an embodiment, in the manufacturing method for the diffusing component, at the preset distance, a spread area of the liquid resin material does not exceed the area of the flat supporting surface.

In an embodiment, in the manufacturing method for the diffusing component, in the step A, the resin material in a liquid state is dispensed on the flat supporting surface.

In an embodiment, in the manufacturing method for the diffusing component, in the step A, the resin material is located at a center position of the flat supporting surface.

In an embodiment, in the manufacturing method for the diffusing component, at the preset distance, a spread area of the liquid resin material does not exceed the area of the flat supporting surface.

In an embodiment, in the manufacturing method for the diffusing component, the flat supporting surface is provided by a supporting plate.

In an embodiment, the manufacturing method for the diffusing component further includes: step D, removing the light-cured resin material from between the mold and the flat supporting surface.

In an embodiment, in the manufacturing method for the diffusing component, where the microlens layer is a microlens array structure composed of a group of stochastically and regularly arranged microlens units, where part of parameters of the microlens units are all different, to prevent light from producing interference fringes when light passes through the diffusing component and propagates in space.

In an embodiment, in the manufacturing method for the diffusing component, in the step A, at least two of the resin materials are arranged on the flat supporting surface and are space aprat.

In an embodiment, in the manufacturing method for the diffusing component, in the step B, the mold has at least two microstructured surfaces respectively corresponding to the resin materials.

In an embodiment, in the manufacturing method for the diffusing component, in the step B, the microstructured surfaces are in different planes, where the spacings between the flat supporting surface and the microstructured surfaces are different, for manufacturing the diffusing components with different thicknesses.

In an embodiment, in the manufacturing method for the diffusing component, in the step A, at least two of the resin materials are arranged on corresponding at least two of the flat supporting surfaces and are spaced apart.

In an embodiment, in the manufacturing method for the diffusing component, where the at least two of the flat supporting surfaces are in different planes, and the spacings between the microstructured surface and the flat supporting surfaces are different to manufacture the diffusing components with different thicknesses.

In an embodiment, in the manufacturing method for the diffusing component, where the resin material is a resin adhesive.

According to another aspect of the present invention, an integrally formed resin diffusing component is further provided according to the present invention, which includes:

a resin substrate; and a microlens layer, where the microlens layer is integrally formed on a surface of the resin substrate by imprinting.

In an embodiment, the diffusing component is integrally formed in such a manner that a resin material in a liquid state spreads between a mold and a flat supporting surface in an imprinted manner, and then the resin material is light-cured, where the mold has a microstructured surface to form the microlens layer of the diffusing component, where the microstructured surface of the mold imprints on the surface of the resin material to form the microlens layer.

In an embodiment, the microlens layer is a microlens array structure composed of a group of non-periodically and regularly arranged microlens units, where part of parameters of the microlens units are all different, to prevent light from producing interference fringes when the light passes through the diffusing component and propagates in space.

According to another aspect of the present invention, a camera module is further provided according to the present invention, which includes:
- a diffusing component,
- a light source unit; and
- a light receiving unit, where the light source unit is configured to emit light, where the diffusing component is configured to modulate the light emitted by the light source unit to form a specific light field distribution, where the light receiving unit receives reflected light, where the diffusing component includes:
- a resin substrate; and
- a microlens layer, where the microlens layer is integrally formed on a surface of the resin substrate by imprinting.

In another aspect of the present invention, a resin DOE manufacturing method is provided according to the present invention, which includes steps of:
- placing a liquid resin material on a first imprinting surface of a first mold and/or a second imprinting surface of a second mold of a manufacturing apparatus;
- performing nanoimprinting on the liquid resin material by operating the first mold and/or the second mold of the manufacturing apparatus in a mold closing manner, to press the liquid resin material to spread in a space between the first imprinting surface of the first mold and the second imprinting surface of the second mold in a filling manner;
- performing a curing operation on the liquid resin material, to allow the liquid resin material to form, after being cured, a resin DOE with an integrally formed structure; and
- taking out the resin DOE as a finished DOE by operating the first mold and/or the second mold of the manufacturing apparatus in a mold opening manner.

In an embodiment of the present invention, the first imprinting surface of the first mold is one micro-nano structured surface, and the second imprinting surface of the second mold is another micro-nano structured surface or a flat substrate surface.

In an embodiment of the present invention, the liquid resin material is a light-curable liquid resin adhesive.

In an embodiment of the present invention, the step of placing a resin material in a liquid state on a first imprinting surface of a first mold and/or a second imprinting surface of a second mold of a manufacturing apparatus includes steps of:
- after the manufacturing apparatus and the liquid resin material are prepared, the liquid resin material with a preset weight is dispensed on a specific region of the second imprinting surface of the second mold of the manufacturing apparatus.

In an embodiment of the present invention, the specific region is a central region of the second imprinting surface of the second mold.

In an embodiment of the present invention, the step of performing nanoimprinting on the liquid resin material by operating the first mold and/or the second mold of the manufacturing apparatus in a mold-closing manner, to press the liquid resin material to spread in a space between the first imprinting surface of the first mold and the second imprinting surface of the second mold in a filling manner includes steps:
- operating the first mold or the second mold to allow the center of the first imprinting surface of the first mold to correspond to the center of the second imprinting surface of the second mold, and the first imprinting surface of the first mold to be parallel to the second imprinting surface of the second mold;
- gradually reducing the spacing between the first imprinting surface of the first mold and the second imprinting surface of the second mold to a preset distance while keeping the first imprinting surface of the first mold and the second imprinting surface of the second mold in parallel with each other; and
- pressing the liquid resin material to spreadingly fill the space outwardly from the center between the first imprinting surface of the first mold and the second imprinting surface of the second mold.

In an embodiment of the present invention, in the step of performing a curing operation on the liquid resin material, to allow the liquid resin material to form, after being cured, a resin DOE with an integrated structure:
- light irradiation treatment is performed on the liquid resin material through the first mold, and after the specified dose is reached, the light irradiation is stopped, so that the liquid resin material is light-cured to form the resin DOE with an integrally formed structure.

According to another aspect of the present invention, a resin DOE is further provided according to the present invention, which includes:
- at least one microstructured layer; and
- a substrate layer, where the substrate layer is integrally connected to the at least one microstructured layer, and the at least one microstructured layer and the substrate layer are manufactured by integrally nanoimprinting a liquid resin material and then curing.

In an embodiment of the present invention, a method for manufacturing the resin DOE includes steps of:
- placing a resin material in liquid state on a first imprinting surface of a first mold and/or a second imprinting surface of a second mold of a manufacturing apparatus;
- performing nanoimprinting on the liquid resin material by operating the first mold and/or the second mold of the manufacturing apparatus in a mold-closing manner, so that the liquid resin material is pressed to spread in a space between the first imprinting surface of the first mold and the second imprinting surface of the second mold in a filling manner;
- performing a curing operation on the liquid resin material, to allow the liquid resin material to form, after being cured, the resin DOE with an integrally formed structure; and
- taking out the resin DOE as a finished DOE by operating the first mold and/or the second mold of the manufacturing apparatus in a mold opening manner.

According to another aspect of the present invention, a manufacturing apparatus for manufacturing a resin DOE from a liquid resin material is further provided according to the present invention, where the manufacturing apparatus includes:
- at least one first mold, where the first mold has a first imprinting surface; and
- at least one second mold, where the second mold has a second imprinting surface, and the first mold and/or the second mold can be operated such that the manufacturing apparatus is switched between a mold closed state and a mold opened state;

where when the manufacturing apparatus is switched from the mold opened state to the mold closed state, the spacing between the first imprinting surface of the first mold and the second imprinting surface of the second mold is reduced, for pressing the liquid resin material to spread in a space between the first imprinting surface of the first mold and the second imprinting surface of the second mold to fill the space, and form the resin DOE after the liquid resin material is cured; and where when the manufacturing apparatus is switched from the mold closed state to the mold opened state, the spacing between the first imprinting surface of the first mold and the second imprinting surface of the second mold becomes large for removing the resin DOE as a finished DOE.

In an embodiment of the present invention, the first imprinting surface of the first mold is one micro-nano structured surface, and the second imprinting surface of the second mold is another micro-nano structured surface or a flat substrate surface.

In an embodiment of the present invention, the first mold is made of a light-transmitting material.

In an embodiment of the present invention, the manufacturing apparatus further includes a spill prevention mechanism, where the spill prevention mechanism is arranged between the first mold and the second mold, and when the manufacturing apparatus is in the mold closed state, the spill prevention mechanism surrounds the first imprinting surface and the second imprinting surface, for blocking the liquid resin material from spreading to regions beyond the first imprinting surface and the second imprinting surface.

In an embodiment of the present invention, the spill prevention mechanism of the manufacturing apparatus includes an annular spill prevention member, specifically, the annular spill prevention member extends convexly from the second imprinting surface of the second mold, and the annular spill prevention member surrounds the second imprinting surface to form a recess with the second imprinting surface as a bottom surface.

In an embodiment of the present invention, the spill prevention mechanism includes an annular spill prevention member, where a part of the annular spill prevention member extends by protruding from the second imprinting surface of the second mold, and another part of the annular spill prevention member extends by protruding from the first imprinting surface of the first mold, and when the manufacturing apparatus is in a mold closed state, the two parts of the annular spill prevention member cooperate with each other to form the complete annular spill prevention member.

In an embodiment of the present invention, the manufacturing apparatus further includes a manufacturing system of a resin DOE. The manufacturing system of the resin DOE includes a material placement module, a mold closing module, a curing module and a mold opening module. The material placement module is configured to place the liquid resin material on the first imprinting surface of the first mold and/or the second imprinting surface of the second mold; the mold closing module is configured to operate the first mold and/or the second mold by mold closing, for nano-imprinting the liquid resin material, so that the liquid resin material is pressed to spread in a space between the first imprinting surface of the first mold and the second imprinting surface of the second mold in a filling manner; the curing module is configured to perform an operation of curing on the liquid resin material, to allow the liquid resin material to form a resin DOE with an integrally formed structure after being cured; and the mold opening module is configured to operate the first mold and/or the second mold of the manufacturing apparatus by mold opening, to take out the resin DOE as a finished DOE.

Further objects and advantages of the present invention are fully presented from the understanding of subsequent description and drawings.

These and other objects, features and advantages of the present invention will be fully presented from the following detailed description, drawings and claims.

DETAILED DESCRIPTION

Figure 1A:
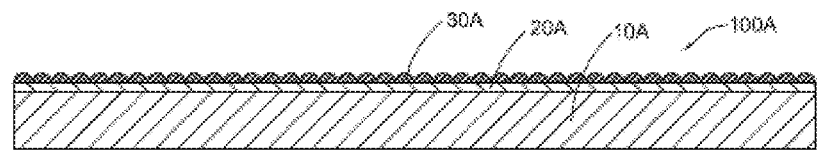
FIG. 1A is a schematic structural diagram of a diffusing component in the conventional technology.
Figure 1B:
FIG. 1B is a schematic structural diagram of another diffusing component in the conventional technology.

The following description serves to disclose the present invention to enable the person skilled in the art to carry out the present invention. The preferred embodiments described below are only examples, and the person skilled in the art can devise other obvious variations. The basic principles of the present invention defined in the following description can be applied to other embodiments, variations, improvements, equivalents and other technical solutions without departing from the spirit and scope of the present invention.

Those skilled in the art should understand that in the disclosure of the present invention, the orientation or positional relationships indicated by terms such as "longitudinal", "transverse", "upper", "lower", "front", "rear", "left", "right", "vertical", "horizontal", "top", "bottom", "inner", "outer", are based on the orientation or positional relationships shown in the drawings, which are only for the convenience of describing the present invention and simplifying the description, rather than indicating or implying that the device or element referred to must have a specific orientation, be configured and operated in a specific orientation, so the above terms should not be construed as limiting the present invention.

It can be understood that the term "a" should be understood as "at least one" or "one or more", that is, in one embodiment, the number of an element can be one, while in another embodiment, the number of the element can be multiple, and the term "a" cannot be understood as a limitation on the quantity.

In the description of this specification, descriptions with reference to the terms "one embodiment", "some embodiments", "example", "specific examples", or "some examples" mean that specific features, structures, materials or characteristics described in connection with the embodiment or example are included in at least one embodiment or example of the present invention. In this specification, the schematic representations of the above terms are not necessarily directed to the same embodiment or example. Furthermore, the described specific features, structures, materials or characteristics may be combined in any suitable manner in any one or more embodiments or examples. In addition, the person skilled in the art can integrate and combine different embodiments or examples and features of different embodiments or examples described in this specification without conflicting with each other.

Figure 2:
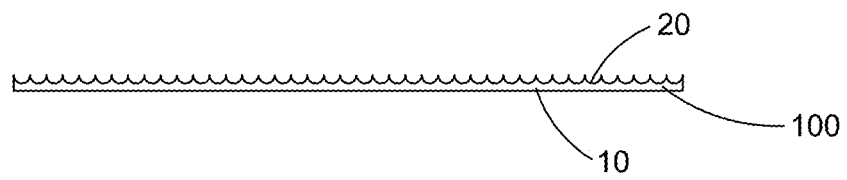
FIG. 2 is a schematic structural diagram of a diffusing component according to a preferred embodiment of the present invention.

FIG. 2 is a schematic structural diagram of a diffusing component 100 according to a preferred embodiment of the present invention. The diffusing component 100 is applicable to an electronic product such as a camera module such as a TOF camera module, a depth camera, 3D imaging, face recognition, smart home, a robot, an unmanned aerial vehicle, AR/VR and automatic driving, etc., where the diffusing component 100 is configured to modulate a light beam emitted by a light source to form a specific homogenous light field within a required field viewing angle range, so as to improve the imaging quality of the electronic product.

As shown in FIG. 2, the diffusing component 100 includes a resin substrate 10 and a microlens layer 20, where the microlens layer 20 is integrally formed on a surface of the resin substrate 10 by imprinting. The resin substrate 10 is a resin material, such as a resin adhesive, where the diffusing component 100 can pass material reliability tests, such as thermal shock, high temperature and high humidity, reflow soldering, micro-drop. Since the diffusing component 100 is made of the resin material, it is not apt to break, and there is no need to install sensors for detecting the breakage in the electronic product, such as a camera module, to which the diffusing component is applied, which reduces the cost of the electronic product. Compared with the conventional injection-molded diffusing component, the diffusing component 100 according to the present invention is integrally formed by imprinting, so that the replication capability is high and the structure restoration capability is strong. Furthermore, in the manufacturing equation of the diffusing component 100, there is no need to use high temperature, no need a cooling and solidifying process, the coefficient of thermal expansion is small, and the energy consumption is low, and the difference between the shape of the diffusing component finally formed and the designed shape is small.

Preferably, the resin material is a light-curable liquid resin material, and the light-cured resin material has a good toughness, high material stability, and is not apt to break. In the process of manufacturing the diffusing component 100, the liquid resin material can be imprinted into a certain pattern to form the microlens layer 20 of the diffusing component 100, and then the liquid resin material is light-cured, to obtain the resin material light-cured, that is, the diffusing component 100. It is to be pointed out that in a manufacturing method for the diffusing component 100, the resin material in the molten state is not required, and it is not required to use high temperature and the cooling and solidifying process are not required. Therefore, compared with the conventional injection-molded diffusing component, the manufacturing process of the diffusing component 100 according to the present invention has a low energy consumption and high replicability, and the difference between the shape of the diffusing component finally formed and the designed shape is small.

For the diffusing component 100 obtained by light-curing the resin material, after the reliability tests that common electronic products must pass, such as thermal shock, reflow soldering, high temperature and high humidity, and drop tests, the diffusing component 100 is not prone to material yellowing, material pulverization and brittleness, and can still ensure reliable transmittance and optical properties.

Figure 4:
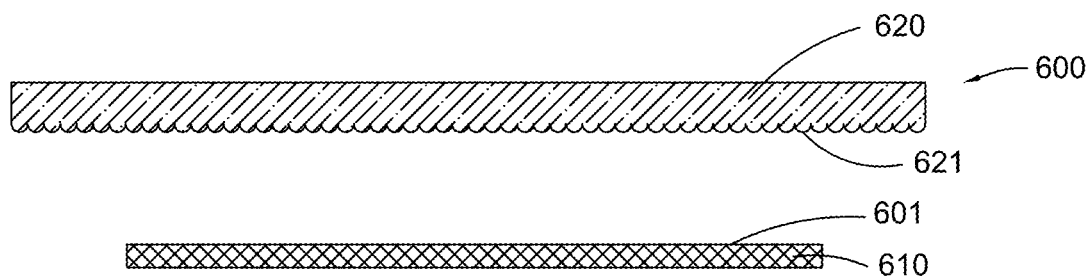
FIG. 4 is a schematic structural diagram of a manufacturing device for manufacturing the diffusing component according to the above preferred embodiment of the present invention.

Further, as shown in FIG. 4, a manufacturing device 600 for manufacturing the diffusing component 100 is further provided according to this preferred embodiment, the manufacturing device 600 includes a supporting plate 610 and a mold 620. The supporting plate 610 has at least one flat supporting surface 601, where the mold 620 has at least one microstructured surface 621 for forming the microlens layer 20 of the diffusing component 100, the microstructured surface 621 corresponds to the flat supporting surface 601, and is separated from the flat supporting surface 601 by a certain spacing D. The mold 620 and the supporting plate 610 can move relatively to reduce or increase the spacing D between the microstructured surface 621 of the mold 620 and the flat supporting surface 601 of the supporting plate 610.

Furthermore, a manufacturing method for the diffusing component 100 is further provided according to this preferred embodiment, which includes: S10, S20 and S30.

S10 may include arranging a preset amount of a light-curable resin material 630 in a liquid state on the flat supporting surface 601 of the supporting plate 610;

S20 may include relatively reducing the spacing D between the microstructured surface 621 of the mold 620 and the flat supporting surface 601 until reaching a preset distance, where the resin material 630 is located between the microstructured surface 621 and the flat supporting surface 601, and at the preset distance, the resin material 630 in a liquid state is spread between the microstructured surface 621 and the flat supporting surface 601 and has a certain spread area, where the microstructured surface 621 of the mold 620 is imprinted on the surface of the resin material 630 to form the microlens layer 20.

S30 may include performing a light-curing treatment on the resin material 630 in a liquid state to obtain the light-cured resin material 630 as the diffusing component 100.

It can be seen that, in the manufacturing method, it is not required to process the resin material 630 by means of high temperature, cooling and solidification.

Figure 3:
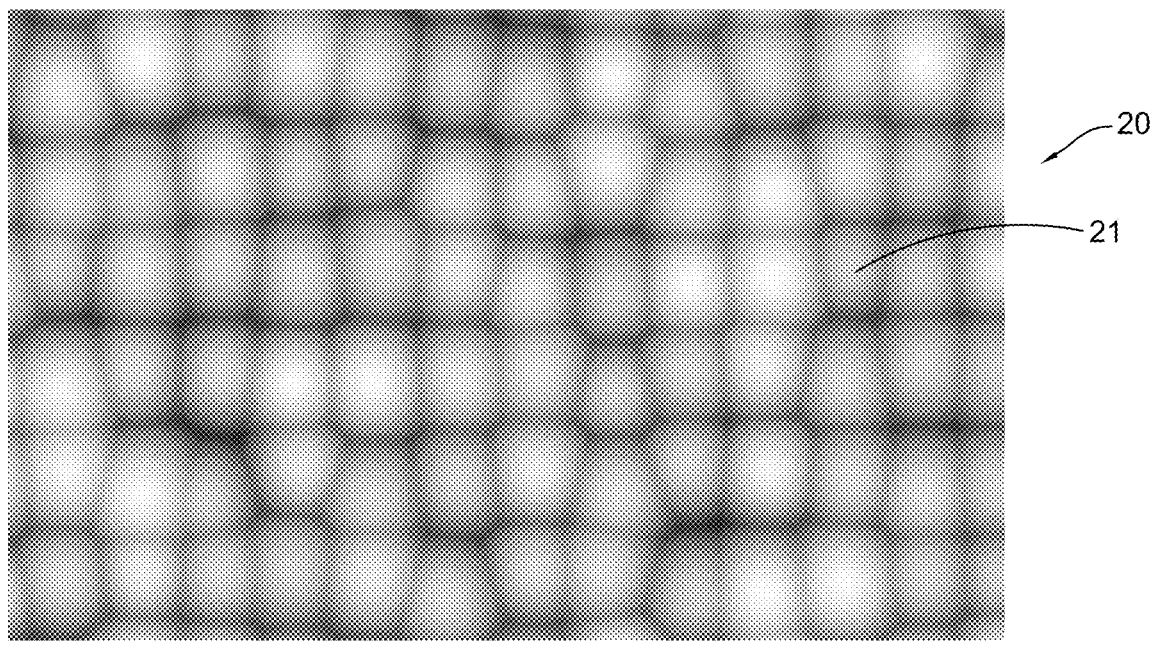
FIG. 3 is a schematic structural diagram of a microlens layer of the diffusing component according to the above preferred embodiment of the present invention.

As shown in FIG. 3, the microlens layer 20 is a microlens array structure composed of a group of stochastically arranged microlens units 21, where some parameters of the microlens units 21 are all different, so as to prevent light from producing interference fringes when the light passes through the diffusing component 100 and propagates in space, which facilitates formation of a homogenous light field.

The microstructured surface 621 of the mold 620 is set to correspondingly imprint to form the microlens structure of the microlens layer 21, that is, the microstructured surface 621 of the mold 620 can be in the liquid state. The surface of the resin material 630 is imprinted to form the microlens array of the microlens layer 21.

Compared with the conventional regularly arranged microlens array, the microlens array of the diffusing component 100 according to the present invention can avoid the phenomenon of producing bright and dark fringes due to the interference effect during the propagation of the light beam in space, and improve the homogeneousness of the light field, which facilitates the improvement of the detection quality. The microlens array implements modulation to the light beam based on the principle of refraction optics, which avoids disadvantages in the conventional diffractive diffusing component that the conventional diffractive diffusing component has the zeroth order which obviously results in poor energy homogeneousness or the conventional light homogenization element has a low diffraction efficiency which results in low transmittance and other disadvantages, thereby facilitating the collection of information by the detection apparatus and improving the detection quality.

Part of the parameters or random regular variables of the microlens units 21 are preset to change stochastically regularly respectively within certain ranges, so that the microlens units 21 have random regularized shapes and sizes or spatial arrangements, that is, the shapes and sizes of any two microlens units 21 are different from each other, and arrangements are irregular, so as to prevent light beam from producing interference fringes when the light beam propagates in space, so as to improve the diffusing effect, thereby meeting the modulation to required spot shape and light intensity distribution of the target lighting scene.

Preferably, the microlens unit 21 has an aspheric surface, which is an optical structure with a power effect. For example, the microlens unit 21 may be a concave lens or a convex lens, which is not specifically limited here. By stochastically processing some of the parameters or variables of the microlens units 21 in a regularized manner, that is, a modulation process, the regulation to the required light spot shape and light intensity distribution of the illumination target scene can be realized. Some random parameters of the microlens unit 21 include but are not limited to radius of curvature, conic constant, aspheric coefficient, shape and size of the effective light aperture of the microlens unit 21, that is, the cross-sectional profile of the microlens unit 21 on the X-Y plane, the spatial arrangement of the microlens units 21, and the surface profile of the microlens unit 21 along the Z-axis direction and other variables.

Preferably, the surface profile z of each of the microlens units 21 is expressed as:

$$z = \frac{cr^2}{1+\sqrt{1-(1+k)c^2r^2}} + \sum_{i=1}^{N} A_i E_i(x, y)$$

where, $$\frac{cr^2}{1+\sqrt{1-(1+k)c^2r^2}}$$

is a basic aspheric term, where c is a curvature of the microlens unit, k is a conic constant, where $$\sum_{i=1}^{N} A_i E_i(x, y)$$

is extended polynomials, where N is the number of the polynomials,
$A_i$ is the coefficient of the $i^{-th}$ extended polynomial, and the polynomial $E_i(x,y)$ is a power series of x and y, where the first term is x, the second term is y, and then x*x, x*y, y*y, . . . .

As an example, the design method of a first embodiment of the microstructured surface 621 of the mold 620 and the microlens array of the diffusing component 20 corresponding to the microstructured surface 621 according to this embodiment includes steps S01, S02, S03 and S04.

The step S01 may include marking off regions where the microlens units 21 are located respectively on the surface of the substrate, the cross-sectional shapes or sizes of the regions where the microlens units 21 are located respectively are basically consistent;

the step S02 may include establishing a global coordinate system (X, Y, Z) for the entire microlens array, and establishing a local coordinate system $(x_i, y_i, z_i)$ for each individual microlens unit, and the central coordinates of the corresponding region are $(x_0, y_0, z_0)$, where the central coordinates of the region represent an initial central position of the corresponding microlens unit 21;

the step S03 may include setting a real center position of each of the microlens units to be a position obtained by adding a random offset $X_{Offset}$, and a random offset $Y_{Offset}$ to central coordinates of the region in an X-axis direction and a Y-axis direction respectively; and the step S04 may include, for each of the microlens units, representing its surface profile in the Z-axis direction by a camber function f:

$$f = \frac{cr^2}{1+\sqrt{1-(1+k)c^2r^2}} + \sum_{i=1}^{N} A_i E_i(x_i - x_0 - X_{offset}, y_i - y_0 - Y_{offset}) + Z_{offset}$$

where, $r^2 = (x_i - x_0 - X_{Offset})^2 + (y_i - y_0 - Y_{Offset})^2$, c is the curvature of the microlens unit, k is the conic constant, $A_i$ is a coefficient of the i-th extended polynomial, and $Z_{Offset}$ is an offset in the Z-axis direction corresponding to each of the microlens units.

It should be pointed out that values of the curvatures c, the conic constants k and the aspheric coefficients $A_i$ of the microlens units are set stochastically in a regularized manner within a certain range according to the application scene used. On the basis of performing stochastically and regularized processing on parameters such as curvatures c, conic constants k, and aspheric surface coefficients $A_i$ of the microlens units within a predetermined range, the coordinates of each of the microlens units are transformed from the local coordinate system $(x_i, y_i, z_i)$ into the global coordinate system (X, Y, Z), and the offset $Z_{Offset}$ in the Z-axis direction corresponding to each of the microlens units is stochastically regularized within a certain range, to allow the surface profile in the Z-axis direction of each of the microlens units to be non-periodically regularized, which prevents the light beam from producing interference fringes so as to achieve a diffusing effect.

In the step S01, the cross-sectional shapes of the regions where the microlens units 21 are located respectively are selected from a group of: rectangle, circle, triangle, trapezoid, polygon or other irregular shapes, which are not limited here.

As an example, a design method of a second embodiment of the microstructured surface 621 of the mold 620 and the microlens array of the diffusing component 20 corresponding to the microstructured surface 621 is provided according to this embodiment, and the design method includes steps: S01a, S02b and S03c.

The step S01a may include marking off regions where the microlens units 21 are located respectively on the surface of the substrate, specifically, the cross-sectional shapes or sizes of the regions where the microlens units 21 are located respectively are different from each other;

the step S02b may include establishing a global coordinate system (X, Y, Z) for the entire microlens array, and establishing a local coordinate system $(x_i, y_i, z_i)$ for each individual microlens unit, and the central coordinates of the local coordinate system are $(x_0, y_0, z_0)$; and the step S03c may include, for each of the microlens units, representing its surface profile in the Z-axis direction by a camber function f:

$$f = \frac{cr^2}{1+\sqrt{1-(1+k)c^2r^2}} + \sum_{i=1}^{N} A_i E_i(x_i - x_0, y_i - y_0) + Z_{offset}$$

where, $r^2 = (x_i - x_0)^2 + (y_i - y_0)^2$, c is the curvature of the microlens unit, k is the conic constant, $A_i$ is the coefficient of the i-th extended polynomial, and $Z_{Offset}$ is an offset in the Z-axis direction corresponding to each of the microlens units.

It should be pointed out that values of the curvatures c, the conic constants k and the aspheric coefficients $A_i$ of the microlens units 21 are set stochastically in a regularized manner within a corresponding certain range according to the application scene used. On the basis of performing stochastically and regularized processing on parameters such as curvatures c, conic constants k, and aspheric surface coefficients $A_i$ of the microlens units 21 within a predetermined range, the coordinates of each of the microlens units 21 are transformed from the local coordinate system $(x_i, y_i, z_i)$ into the global coordinate system (X, Y, Z), and the offset $Z_{Offset}$ in the Z-axis direction corresponding to each of the microlens units 21 is stochastically processed in a regularized manner within a certain range, to allow the surface profile in the Z-axis direction of each of the microlens units 21 to be non-periodically regularized, which prevents the light beam from producing interference fringes so as to achieve a diffusing effect.

Further, in the manufacturing method for the diffusing component 100, in the step S20, the mold 620 is kept parallel to the flat supporting surface 601. That is, when the mold 620 and the supporting plate 610 are moved relative to each other, the microstructured surface 621 of the mold 620 and the flat supporting surface 601 of the supporting plate 610 are always kept parallel to each other. In other words, in the step S20, the spacing between the mold 620 and the flat supporting surface 601 is relatively reduced while the mold 620 and the flat supporting surface 601 are kept parallel to each other.

Figure 5:
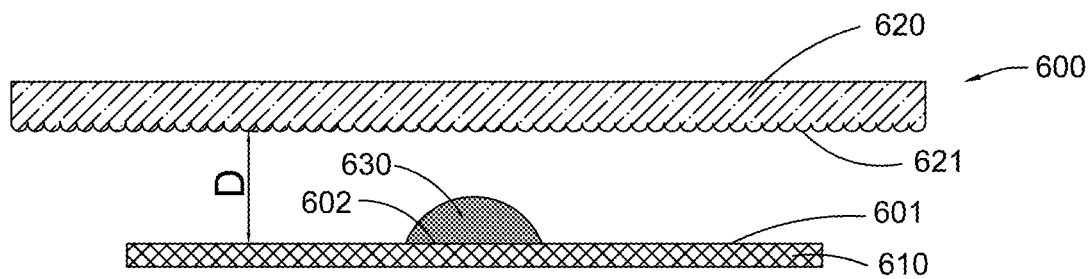
FIG. 5 is a schematic structural diagram showing a manufacturing process of the manufacturing device for manufacturing the diffusing component according to the above preferred embodiment of the present invention.
Figure 6:
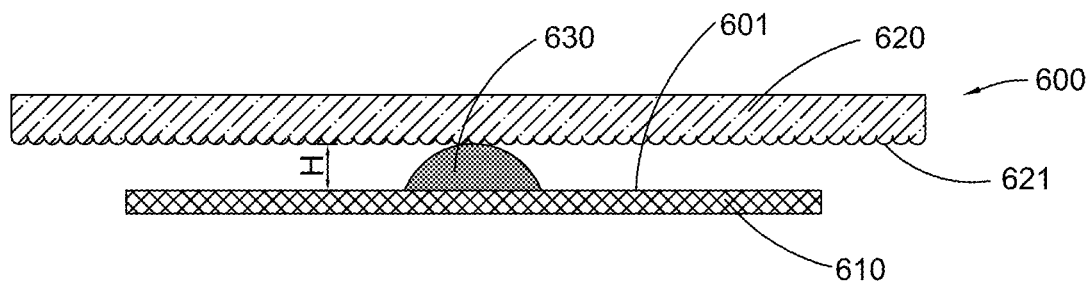
FIG. 6 is a schematic structural diagram showing a manufacturing process of the manufacturing device for manufacturing the diffusing component according to the above preferred embodiment of the present invention.

Further, as shown in FIG. 5 and FIG. 6, the step S20 may include S21 and S22.

S21 may include relatively reducing the spacing D between the mold 620 and the flat supporting surface 601 until reaching a position where the microstructured surface 621 of the mold 620 contacts the resin material 630; and S22 may include continuing to relatively reduce the spacing between the mold 620 and the flat supporting surface 601 until the preset distance is reached, where the resin material 630 in a liquid state is gradually spread between the microstructured surface 621 and the flat supporting surface 601, where in the step S21 and the step S22, the mold is always kept relatively parallel to the flat supporting surface.

In the step S10, the resin material 630 in a liquid state can be dispensed on the flat supporting surface 601, where the resin material 630 in a liquid state is raised and supported on the flat supporting surface 601, that is to say, the resin material 630 in a liquid state may have a certain height H and volume. For example, a preset amount of the resin material 630 in a liquid state can be arranged on the flat supporting surface 601 by a dispensing device.

In the step S21, the spacing D between the mold 620 and the flat supporting surface 601 is greater than the height H of the resin material 630, and the spacing D between the mold 620 and the flat supporting surface 601 is gradually decreased until a position is reached where the microstructured surface 621 of the mold 620 basically touches the resin material 630, at this time, the spacing D between the mold 620 and the flat supporting surface 601 is basically equal to the Height H of the resin material 630.

It can be understood that, in the step S21, the resin material 630 is still not pressed between the mold 620 and the flat supporting surface 601, therefore, the speed of relative movement between the mold 620 and the flat supporting surface 601 can be adjusted accordingly to shorten the manufacturing time.

Figure 7:
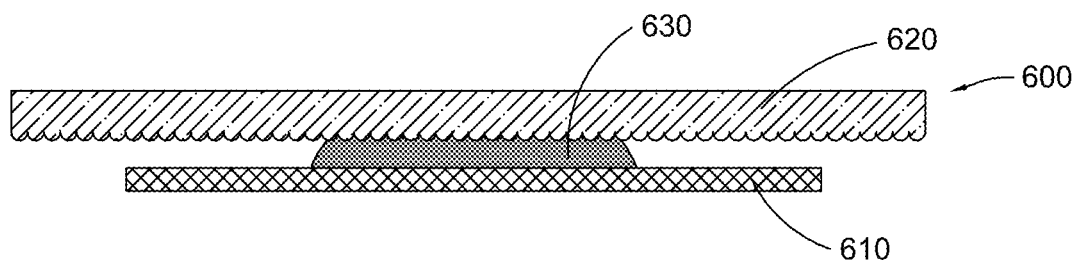
FIG. 7 is a schematic structural diagram showing a manufacturing process of the manufacturing device for manufacturing the diffusing component according to the above preferred embodiment of the present invention.
Figure 8:
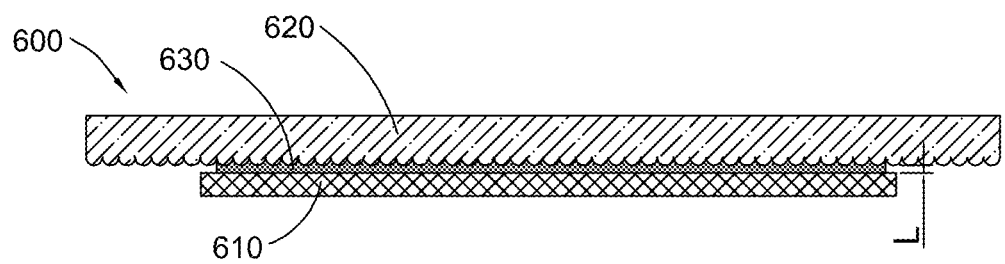
FIG. 8 is a schematic structural diagram showing that the manufacturing device for manufacturing the diffusing component relatively reduces a spacing between a mold and a flat supporting surface to a preset distance L in a manufacturing process according to the above preferred embodiment of the present invention.

In the step S22, as shown in FIG. 7, as the spacing between the mold 620 and the flat supporting surface 601 is further relatively reduced, the resin material 630 in a liquid state is pressed to spread outward between the mold 620 and the flat supporting surface 601, and the horizontal area of the resin material 630 in a liquid state gradually increases, and the height of the resin material 630 in a liquid state gradually decreases, until the spacing D between the mold 620 and the flat supporting surface 601 reaches the preset distance L, as shown in FIG. 8, the spacing D between the mold 620 and the flat supporting surface 601 does not continue to decrease, at this time, the height of the resin material 630 in a liquid state reaches a minimum value, and is the preset distance L, while the horizontal area reaches a maximum value.

In the step S22, in order to ensure that the resin material 630 in a liquid state spreads evenly, the mold 620 and the flat supporting surface 601 are always kept parallel during the relative movement. Furthermore, in the step S22, the speed of the relative movement between the mold 620 and the flat supporting surface 601 can be regulated.

It can be understood that, in the step S22, a barrier element for restricting the spreading of the resin material 630 in a liquid state may be provided between the mold 620 and the flat supporting surface 601, to change the spreading direction of the resin material 630 in a liquid state, so as to control the planar shape of the resin material 630 in a liquid state finally formed by the spreading, so as to obtain the diffusing components 100 of different shapes.

It is worth mentioning that, at the preset distance L, the spread area of the liquid resin material does not exceed the area of the flat supporting surface 601. That is to say, in the step S10, the amount of the resin material 630 in a liquid state arranged on the flat supporting surface 601 can be controlled, so that at the preset distance L, the spread area of the resin material 630 in a liquid state reaches a preset area, so as to obtain the diffusing component 100 of a corresponding size.

Preferably, in the step S10, the resin material 630 in a liquid state may be located at a center position 602 of the flat supporting surface 601, or close to the center position. The person skilled in the art can understand that, when to manufacture multiple diffusing components 100 at the same time, multiple resin materials 630 in a liquid state can be separately arranged in multiple different positions on the flat supporting surface 601, and when the spacing D between the mold 620 and the flat supporting surface 601 is reduced to the preset distance L, the spread multiple resin materials 630 in a liquid state do not interfere with each other, or do not contact with each other.

Figure 13:
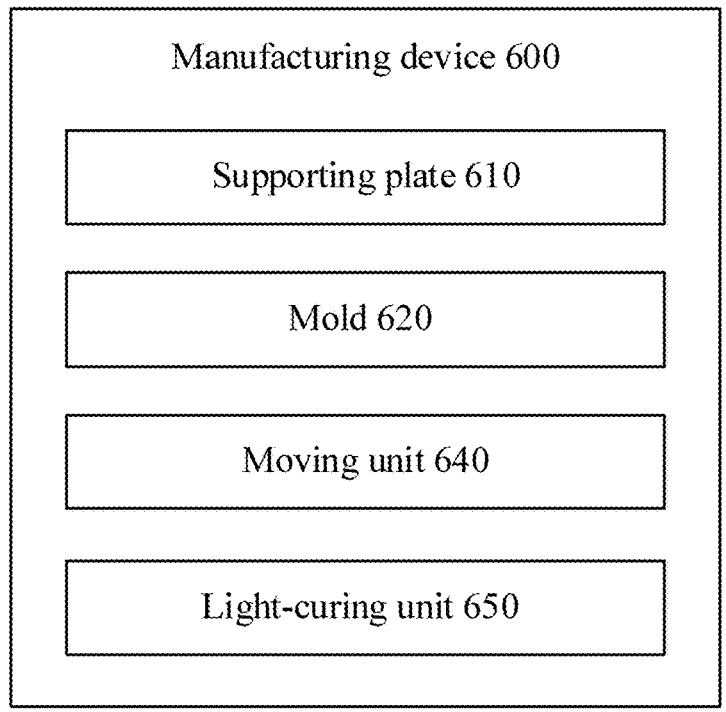
FIG. 13 is a structural block diagram of the manufacturing device for manufacturing the diffusing component according to the above preferred embodiment of the present invention.

Further, as shown in FIG. 13, the manufacturing device 600 further includes a moving unit 640 for moving the mold 620 and the supporting plate 610 relative to each other, where the moving unit 640 can move the mold 620 and the supporting plate 610 relative to each other while keeping the mold 620 and the supporting plate 610 parallel to each other, to change the spacing D between the mold 620 and the supporting plate 610. Optionally, the moving unit 640 is used to move the mold 620, where the supporting unit 610 remains stationary. Optionally, the moving unit 640 is used to move the supporting unit 610, and the mold 620 remains stationary. Optionally, the moving unit 640 is used to move the supporting unit 610 and the mold 620 relative to each other at the same time. Those skilled in the art know that the transmission mechanism of the moving unit 640 may be a gear structure, a conveyor belt, a piston, a stepping motor, etc., which is not limited here.

Figure 9:
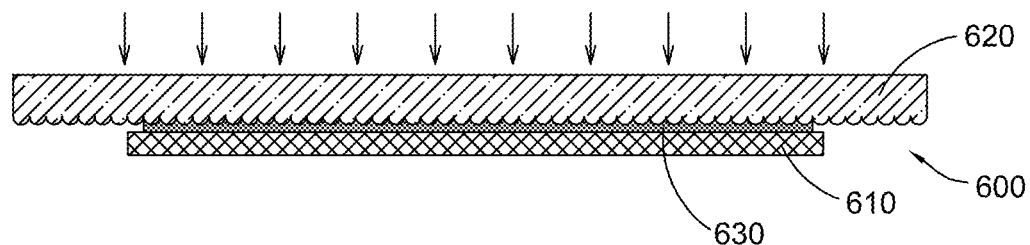
FIG. 9 is a schematic diagram showing a manufacturing process of the manufacturing device for manufacturing the diffusing component in which a liquid resin material is light-cured according to the above preferred embodiment of the present invention.

As shown in FIG. 9, in the step S30, the resin material 630 in a liquid state is subjected to light-curing treatment, so that the resin material 630 in a liquid state is solidified and formed, thereby obtaining the diffusing component 100. That is to say, the resin material 630 after being light-cured is the diffusing component 100, which has good toughness and strength.

Further, the manufacturing device 600 further includes a light-curing unit 650, where the light-curing unit 650 is configured to perform a light-curing treatment on the resin material 630 in a liquid state, where the light-curing unit 650 may include a light source for emitting light to achieve light-curing effect.

Figure 10:
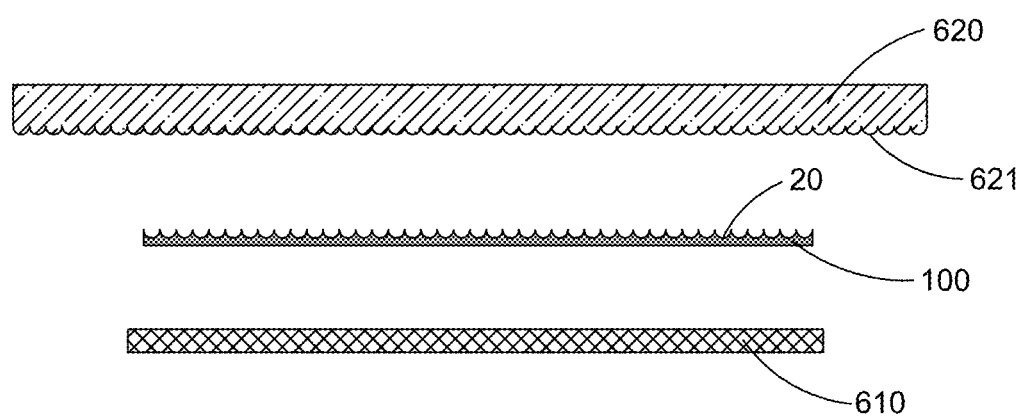
FIG. 10 is a schematic diagram of obtaining the diffusing component from the manufacturing process of the manufacturing device for manufacturing the diffusing component according to the above preferred embodiment of the present invention.

As shown in FIG. 10, the manufacturing method further includes: S40.

S40 may include removing the light-cured resin material 630 from between the mold 620 and the flat supporting surface 601.

Preferably, the moving unit 640 can move the mold 620 and the flat supporting surface 601 relative to each other to reduce the spacing D between the mold 620 and the flat supporting surface 601, and when the spacing D reaches the preset distance L, the moving unit 640 will not continue to reduce the spacing between the mold 620 and the flat supporting surface 601, and after the light-curing unit 650 performs a light-curing treatment on the resin material 630, the moving unit 640 moves the mold 620 and the flat supporting surface 60 relative to each other to increase the spacing D between the mold 620 and the flat supporting surface 601, so as to facilitate the taking out of the light-cured resin material 630, and facilitate the manufacturing of the diffusing components of a next batch, to achieve industrial batch production.

Figure 11A:
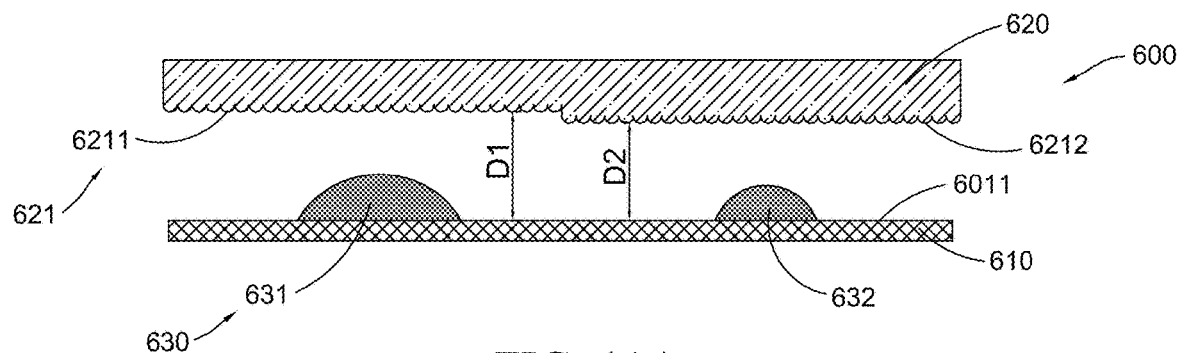
FIG. 11A is a schematic structural diagram of a manufacturing process of the manufacturing device for manufacturing the diffusing component according to a first variant embodiment of the above preferred embodiment of the present invention.
Figure 11B:
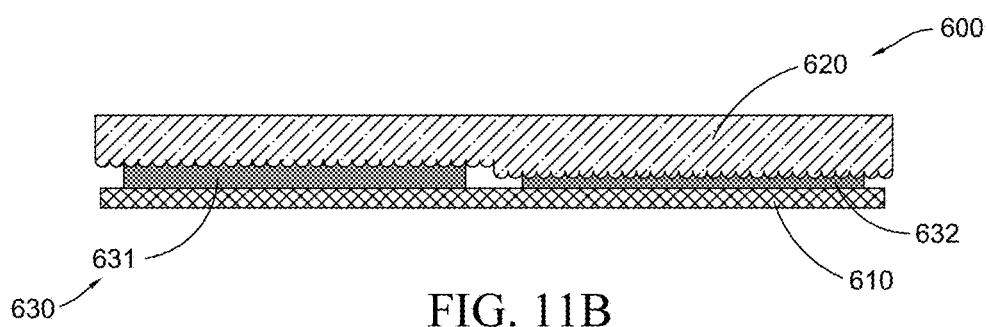
FIG. 11B is a schematic structural diagram of a manufacturing process of the manufacturing device for manufacturing the diffusing component according to a first variant embodiment of the above preferred embodiment of the present invention.
Figure 11C:
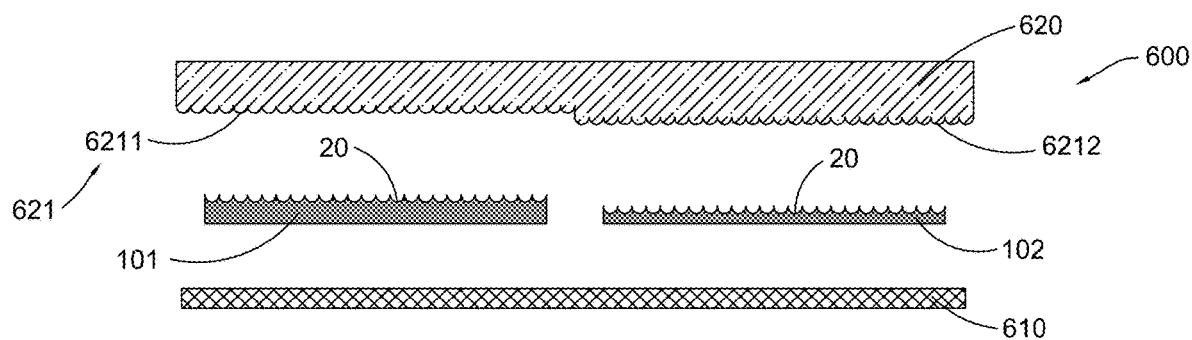
FIG. 11C is a schematic structural diagram of a manufacturing process of the manufacturing device for manufacturing the diffusing component according to a first variant embodiment of the above preferred embodiment of the present invention.

In the first modified implementation of this preferred embodiment, the manufacturing device 600 can simultaneously manufacture the diffusing component 100 with different thicknesses. As shown in FIG. 11A to FIG. 11C, the microstructured surface 621 of the mold 620 includes a first microstructured surface 6211 and a second microstructured surface 6212 in different planes, where a first spacing D1 between the first microstructured surface 6211 and the flat supporting surface 601 is greater than a second spacing D2 between the second microstructured surface 6212 and the flat supporting surface 601. A first diffusing component 101 can be formed by imprinting correspondingly between the first microstructured surface 6211 and the flat supporting surface 601, and a second diffusing component 102 can be formed by imprinting correspondingly between the second microstructured surface 6212 and the flat supporting surface 601, where the thickness of the first diffusing component 101 is greater than the thickness of the second diffusing component 102.

In the step S10, at least two resin materials 630 are separately arranged on the flat supporting surface 601, where the at least two resin materials 630 respectively correspond to the microstructured surfaces 621 in different planes. As shown in FIG. 11A, the two resin materials 630 are respectively a first resin material 631 and a second resin material 632, where the first resin material 631 is arranged between the first microstructured surface 6211 and the flat supporting surface 601, and where the second resin material 632 is arranged between the second microstructured surface 6212 and the flat supporting surface 601.

It can be understood that the amounts of the liquid first resin material 631 and the liquid second resin material 632 can be adjusted accordingly according to practical requirements, so as to manufacture the required diffusing components 100 with different thicknesses. Further, in the step S20, the spread first resin material 631 and the spread second resin material 632 do not interfere with each other and do not contact each other.

Figure 12A:
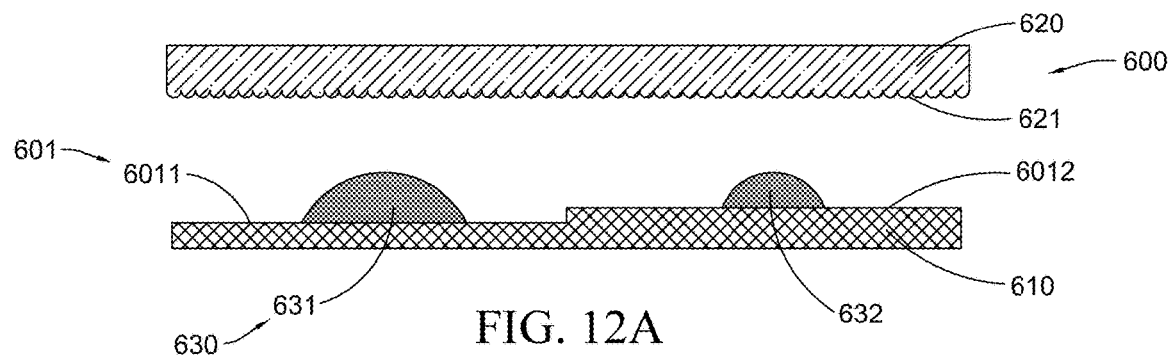
FIG. 12A is a schematic structural diagram of a manufacturing process of the manufacturing device for manufacturing the diffusing component according to a second variant embodiment of the above preferred embodiment of the present invention.
Figure 12B:
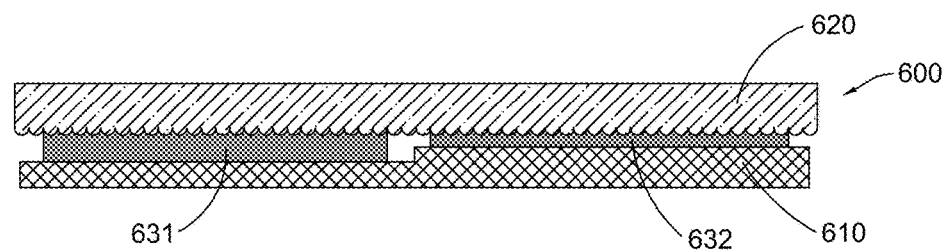
FIG. 12B is a schematic structural diagram of a manufacturing process of the manufacturing device for manufacturing the diffusing component according to a second variant embodiment of the above preferred embodiment of the present invention.
Figure 12C:
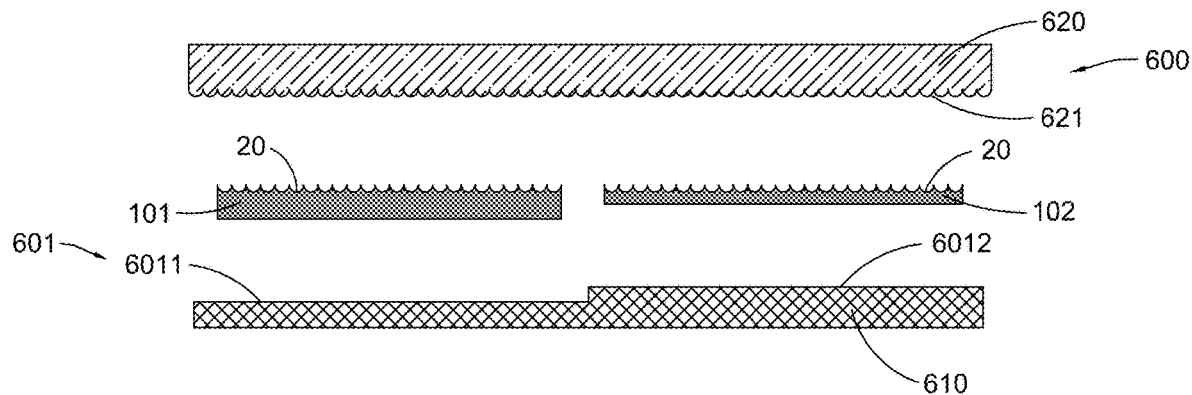
FIG. 12C is a schematic structural diagram of a manufacturing process of the manufacturing device for manufacturing the diffusing component according to a second variant embodiment of the above preferred embodiment of the present invention.

In the second modified implementation of this preferred embodiment, as shown in FIG. 12A to FIG. 12C, the flat supporting surface 601 of the supporting plate 610 includes a first flat supporting surface 6011 and a second flat supporting surface 6012 in different planes, where the spacing between the first flat supporting surface 6011 and the microstructured surface 621 is greater than the spacing between the second flat supporting surface 6012 and the microstructured surface 621. The first diffusing component 101 can be formed by imprinting correspondingly between the microstructured surface 621 and the first flat supporting surface 6011, and the second diffusing component 102 can be formed by imprinting correspondingly between the microstructured surface 621 and the second flat supporting surface 6012, and where the thickness of the first diffusing component 101 is greater than the thickness of the second diffusing component 102.

In the step S10, at least two resin materials 630 are arranged on the first flat supporting surface 6011 and the second flat supporting surface 6012 respectively. As shown in FIG. 12A, the first resin material 631 is arranged on the first flat supporting surface 6011, and the second resin material 632 is arranged on the second flat supporting surface 6012.

Apparently, the person skilled in the art can understand that the manufacturing device 600 can also manufacture more diffusing components 100 with different thicknesses at the same time. For example, the mold 620 may further have more microstructured surfaces 621 in different planes, or the supporting plate 610 may have more flat supporting surfaces 601 in different planes, or both the mold 620 may have multiple microstructured surfaces 621 in different planes and the supporting plate 610 may have corresponding multiple flat supporting surfaces 601 in different planes, which is not limited here.

Figure 14:
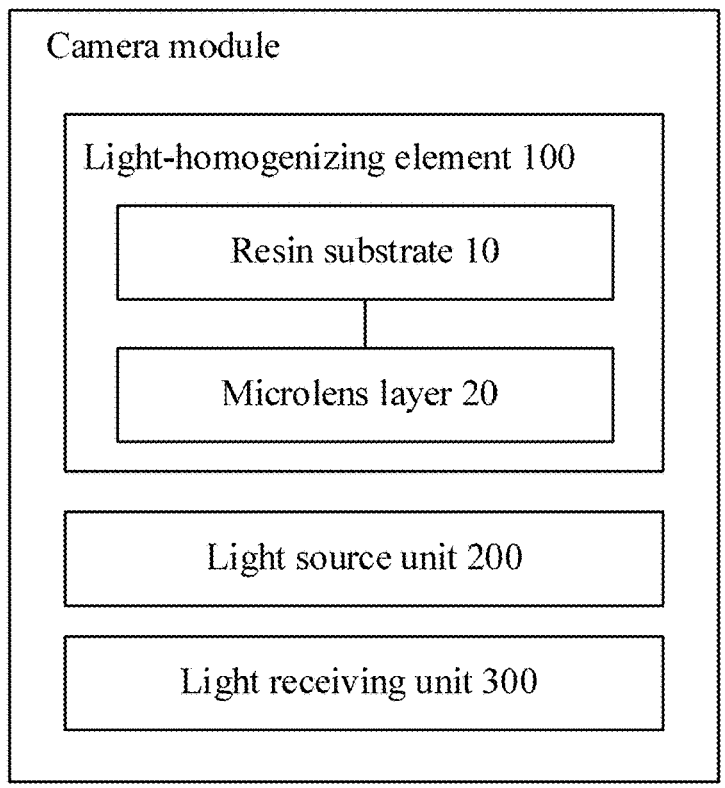
FIG. 14 is a structural block diagram of an imaging module for the diffusing component according to the above preferred embodiment of the present invention.
Figure 15A:
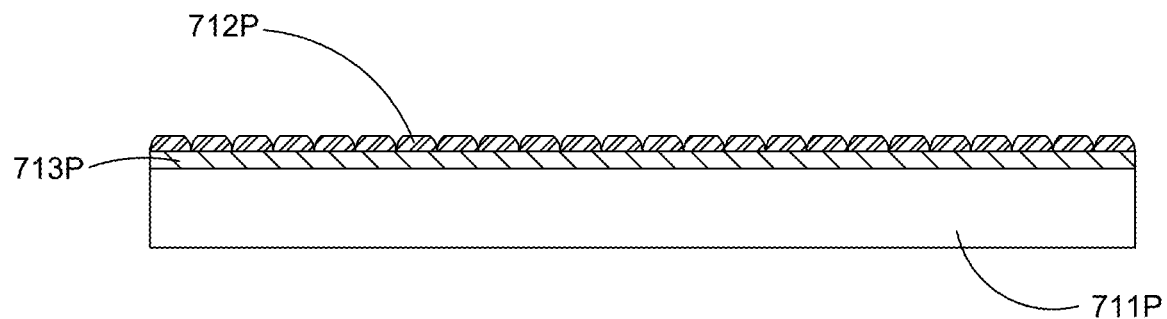
FIGS. 15A and 15B are schematic structural diagrams of a DOE finished product in the conventional technology.
Figure 15B:
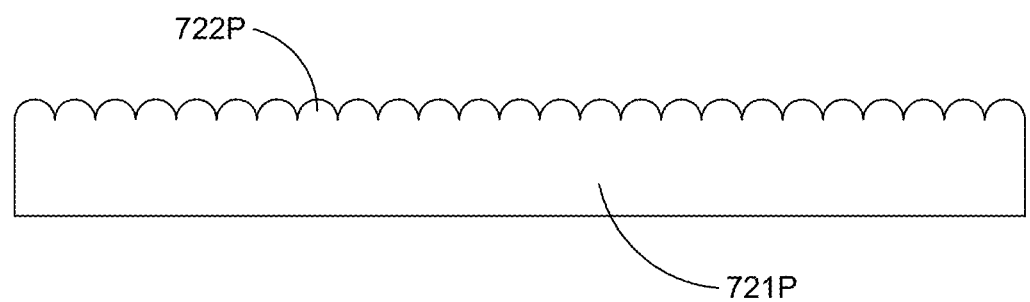

Further, as shown in FIG. 14, a camera module applying the diffusing component 100 is further provided according to this preferred embodiment, where the camera module includes the diffusing component 100, a light source unit 200 and a light receiving unit 300. The light source unit 200 is used to emit light, the diffusing component 100 is used to modulate the light emitted by the light source unit 200 to form a specific light field distribution, and the light receiving unit 300 receives reflected light. The diffusing component 100 includes the resin substrate 10 and the microlens layer 20, specifically, the microlens layer 20 is integrally formed on the surface of the resin substrate 10 by imprinting.

Further, the microlens layer 20 is a microlens array structure composed of a group of stochastically regularly arranged microlens units 21, where some parameters of the microlens units are all different, so as to prevent light beam from producing interference fringes when the light beam passes through the homogeneous element and propagates in space.

Figure 16:
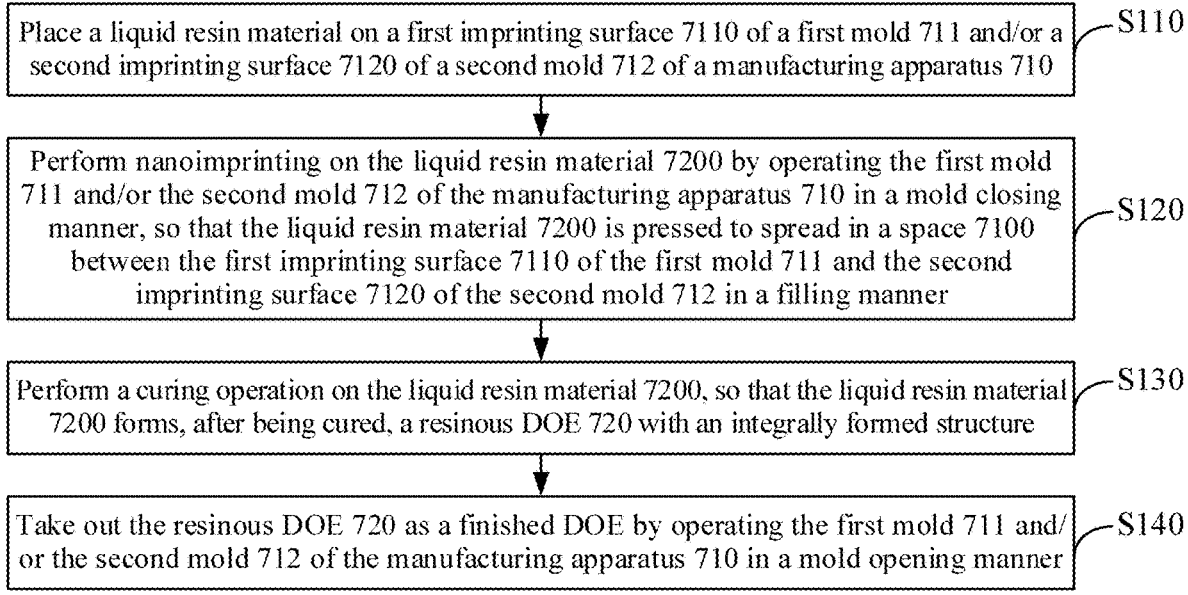
FIGS. 16 and 17 are schematic flowcharts of a manufacturing method of a resin DOE according to an embodiment of the present invention.
Figure 17:
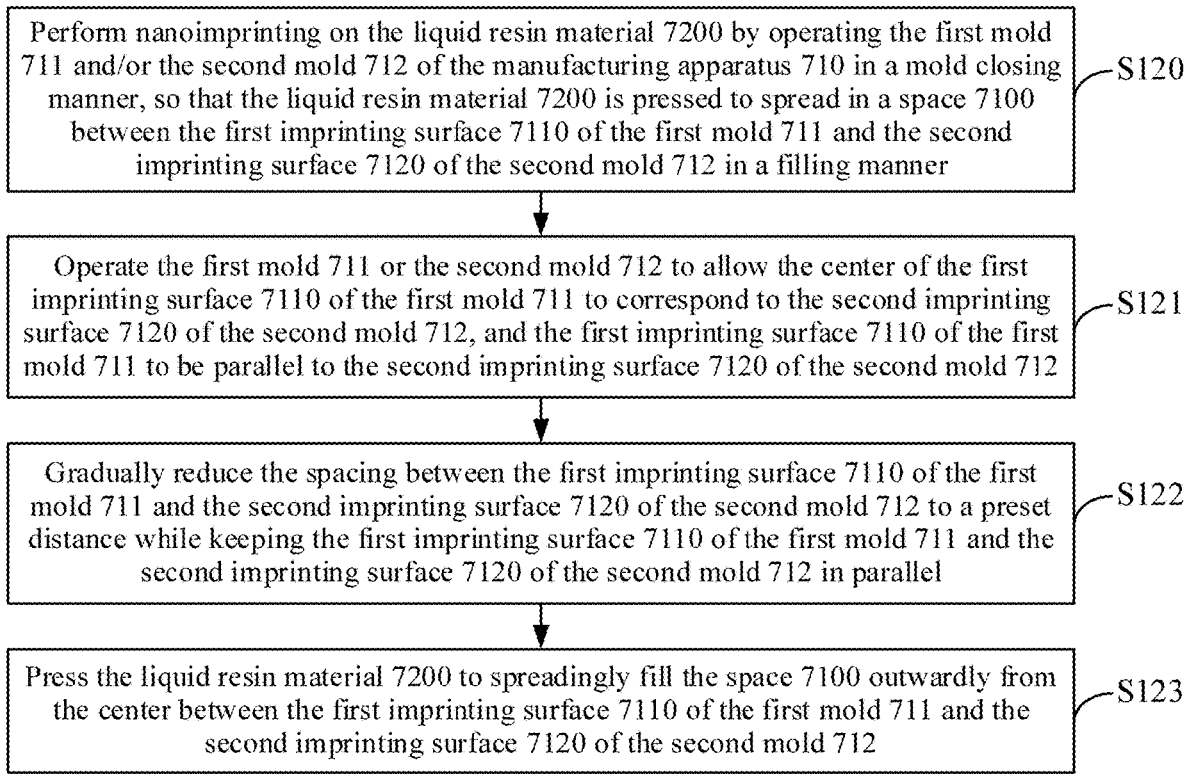

Referring to FIG. 16 and FIG. 17 of the drawings of the specification, a manufacturing method of a resin DOE according to an embodiment of the present invention is illustrated. Specifically, as shown in FIG. 16, the manufacturing method of the resin DOE may include steps: S110, S120, S130 and S140.

The step S110 may include placing a resin material in a liquid state on a first imprinting surface 7110 of a first mold 711 and/or a second imprinting surface 7120 of a second mold 712 of a manufacturing apparatus 710;

the step S120 may include performing nanoimprinting on the liquid resin material 7200 by operating the first mold 711 and/or the second mold 712 of the manufacturing apparatus 710 in a mold closing manner, so that the liquid resin material 7200 is pressed to spread in a space 7100 between the first imprinting surface 7110 of the first mold 711 and the second imprinting surface 7120 of the second mold 712 in a filling manner;

the step S130 may include performing a curing operation on the liquid resin material 7200, so that the liquid resin material 7200 forms, after being cured, a resin DOE 720 with an integrally formed structure; and the step S140 may include taking out the resin DOE 720 as a finished DOE by operating the first mold 711 and/or the second mold 712 of the manufacturing apparatus 710 in a mold opening manner.

It is worth noting that since the finished DOE (that is, the resin DOE720 is formed by nano-imprinting a resin material that is integral in itself, it has an integrally formed structure, so the resin DOE720 has advantages of a good toughness, being not apt to break, small thermal expansion, strong structural restoring capability and low cost. In particular, since the resin DOE720 has an integrally formed structure, the manufacturing method of the resin DOE of the present invention can completely address the issue of delamination of the glass substrate from the micro-nano structure of the resin layer in the conventional DOE products. In addition, since the resin DOE720 is not apt to break, the resin DOE720 is used as an optical device in the module, and there is no need to add an additional sensing means for sensing breakage in the module, which reduces the cost of the module end and the cost of the end-user product.

Figure 18:
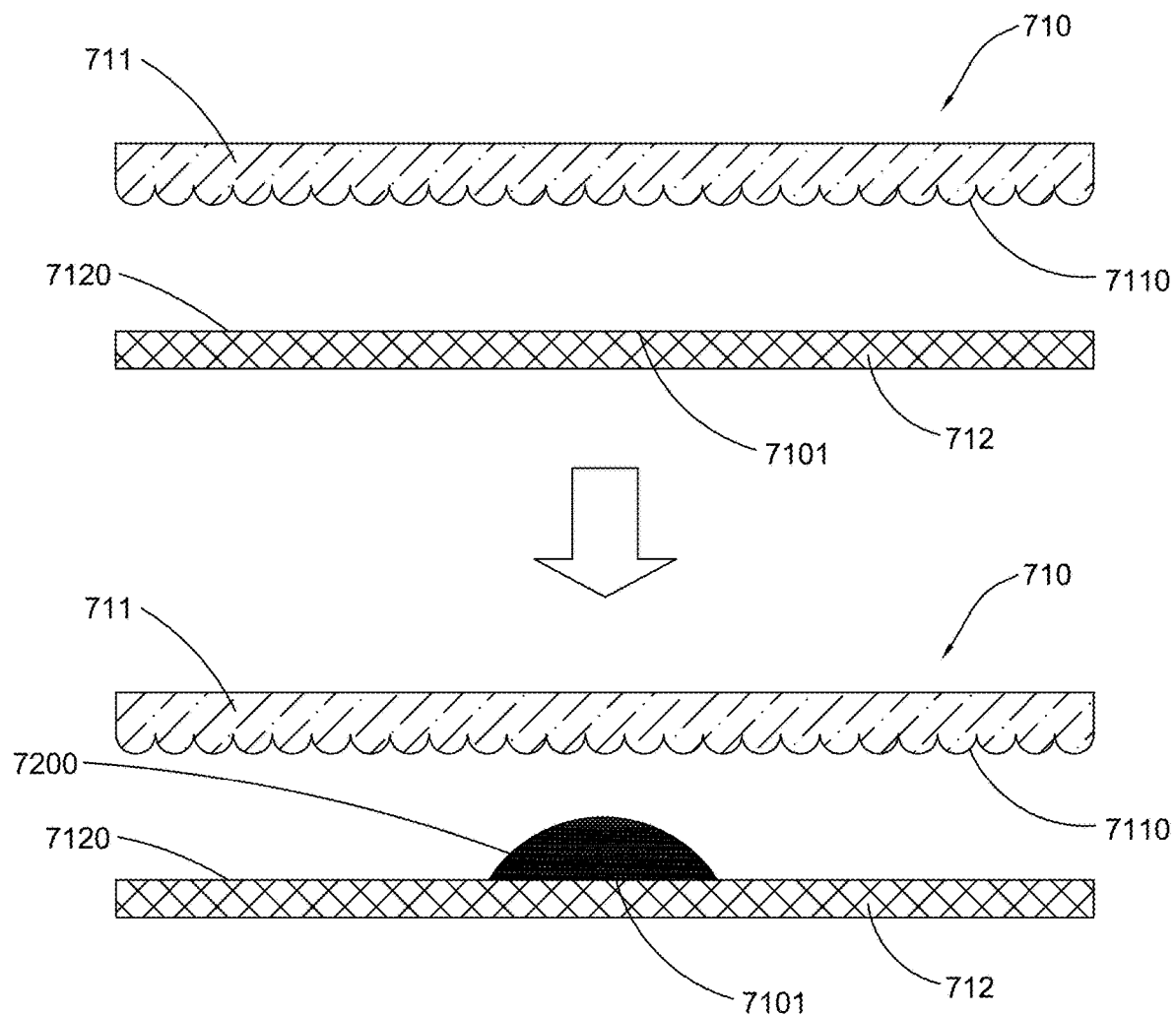
FIG. 18 shows an example of a material placement step in the manufacturing method of the resin DOE according to the above embodiments of the present invention.

More specifically, in the above embodiments of the present invention, as shown in FIG. 18, the first imprinting surface 7110 of the first mold 711 of the manufacturing apparatus 710 can be implemented as a micro-nano structured surface, so that at least one required microstructured layer 721 may be formed on the side of the resin DOE 720 facing the first imprinting surface 7110 of the first mold 711, for diffracting light waves. It can be understood that, the structural shape and size of the microstructured layer 721 of the resin DOE 720 correspond to the structural shape and size of the micro-nano structured surface of the first imprinting surface 7110 of the first mold 711, that is to say, the present invention can manufacture the resin DOE 720 with the microstructured layer 721 by adjusting the micro-nano structure of the first imprinting surface 7110 of the first mold 711, to allow the resin DOE DOE720 to have the required diffraction performance For example, the first imprinting surface 7110 of the first mold 711 can be, but is not limited to be, implemented as a micro-nano structured surface with a micro-nano structure such as a microlens structure, a Fresnel lens structure, a stepped diffraction structure, and a multi-order phase lens structure.

It is worth mentioning that, in the above embodiments of the present invention, as shown in FIG. 18, the second imprinting surface 7120 of the second mold 712 of the manufacturing apparatus 710 can be implemented as a flat substrate surface, in this way, a flat substrate layer 722 will be formed on the side of the resin DOE 720 facing the second imprinting surface 7120 of the second mold 712. In particular, since the resin DOE720 is formed by integral nano-imprinting an integral liquid resin material through the manufacturing apparatus 710, the microstructured layer 721 of the resin DOE720 is integrally connected to the substrate layer 722, and the microstructured layer 721 of the resin DOE720 and the substrate layer 722 have exactly the same material, that is to say, the microstructured layer 721 integrally extends from the substrate layer 722 to form the resin DOE 720 with an integrated structure, thus completely addressing the issue of delamination of the glass substrate from the resin layer micro-nano structure in conventional DOE products.

Apparently, in other examples of the present invention, the second imprinting surface 7120 of the second mold 712 of the manufacturing apparatus 710 can further be implemented as another micro-nano structured surface, to allow the microstructured layer to be formed on each of two sides of the resin DOE 720, so as to realize the required diffraction effect through the two microstructured layers jointly.

According to the above embodiments of the present invention, the liquid resin material 7200 is preferably implemented as a light-curable liquid resin adhesive, so that the liquid resin material 7200 is cured by light to form the resin DOE 720. It can be understood that, since the liquid resin material 7200 used in the present invention is a light-curable liquid resin adhesive, which can be cured simply by light irradiation without high temperature heating, the finished DOE manufactured by the manufacturing method of the resin DOE according to the present invention has a small thermal expansion, and has a small structural difference from the design, which facilitates the improvement of the manufacturing quality of the resin DOE720.

Exemplarily, as shown in FIG. 18, in the step S110 of the manufacturing method of the resin DOE according to the present invention: after the manufacturing apparatus 710 and the liquid resin material 7200 are prepared, a preset weight of liquid resin material 7200 is dispensed on a specific region 7101 on the second imprinting surface 7120 of the second mold 712 of the manufacturing apparatus 710. In other words, on a central region of the second imprinting surface 7120 of the second mold 712 of the manufacturing apparatus 710, a preset weight of light-curable liquid resin adhesive (i.e., liquid resin material 7200 is dispensed. Apparently, in other examples of the present invention, the liquid resin material 7200 can also be dispensed on the first imprinting surface 7110 of the first mold 711 of the manufacturing apparatus 710, or the liquid resin material 7200 may further be dispensed on the first imprinting surface 7110 of the first mold 711 and the second imprinting surface 7120 of the second mold 712 of the manufacturing apparatus 710, to allow each of the first imprinting surface 7110 of the first mold 711 and the second imprinting surface 7120 of the second mold 712 has the liquid resin material 7200 dispensed thereon.

Preferably, as shown in FIG. 18, the specific region 7101 can be implemented as the central region on the second imprinting surface 7120 of the second mold 712, to allow the liquid resin material 7200 located at the specific region 7101 to spread outward from the center of the second imprinting surface 7120 when being pressed, so as to ensure that the liquid resin material 7200 can spread evenly to fill the space 7100 between the first imprinting surface 7110 of the first mold 711 and the second imprinting surface 7120 of the second mold 712, to ensure that the resin DOE 720 has a high consistent density distribution. In particular, using the central region of the second imprinting surface 7120 as the specific region 7101 can further effectively prevent the liquid resin material 7200 from spreading to the position beyond the second imprinting surface 7120 before filling the space 7100 between the first imprinting surface 7110 of the first mold 711 and the second imprinting surface 7120 of the second mold 712.

Apparently, in another example of the present invention, the specific region 7101 can also be implemented as a non-central region on the second imprinting surface 7120 of the second mold 712 (such as on an edge region of the second imprinting surface 7120, in this way, the liquid resin material 7200 will spread inwardly from the edge of the second imprinting surface 7120 to fill up the space 7100 between the first imprinting surface 7110 of the first mold 711 and the second imprinting surface 7120 of the second mold 712.

In addition, the preset weight of the present invention may be obtained according to the volume of the space 7100 between the first imprinting surface 7110 of the first mold 711 and the second imprinting surface 7120 of the second mold 712 being converted into the weight of the liquid resin material 7200. Apparently, in other examples of the present invention, the preset weight can also be preset based on experience or the size of the second imprinting surface 7120 of the second mold 712, as long as it can ensure that the liquid resin material 7200 can fill up the space 7100, which is not repeated in the present invention.

According to the above embodiments of the present invention, as shown in FIG. 17, the step S120 of the manufacturing method of the resin DOE may include steps of: S121, S122 and S123.

The step S121 may include operating the first mold 711 or the second mold 712 to allow the center of the first imprinting surface 7110 of the first mold 711 to correspond to the center of the second imprinting surface 7120 of the second mold 712, and the first imprinting surface 7110 of the first mold 711 to be parallel to the second imprinting surface 7120 of the second mold 712;

the step S122 may include gradually reducing the spacing between the first imprinting surface 7110 of the first mold 711 and the second imprinting surface 7120 of the second mold 712 to a preset distance while keeping the first imprinting surface 7110 of the first mold 711 and the second imprinting surface 7120 of the second mold 712 in parallel with each other; and the step S123 may include pressing the liquid resin material 7200 to spreadingly fill the space 7100 outwardly from the center between the first imprinting surface 7110 of the first mold 711 and the second imprinting surface 7120 of the second mold 712.

Figure 19:
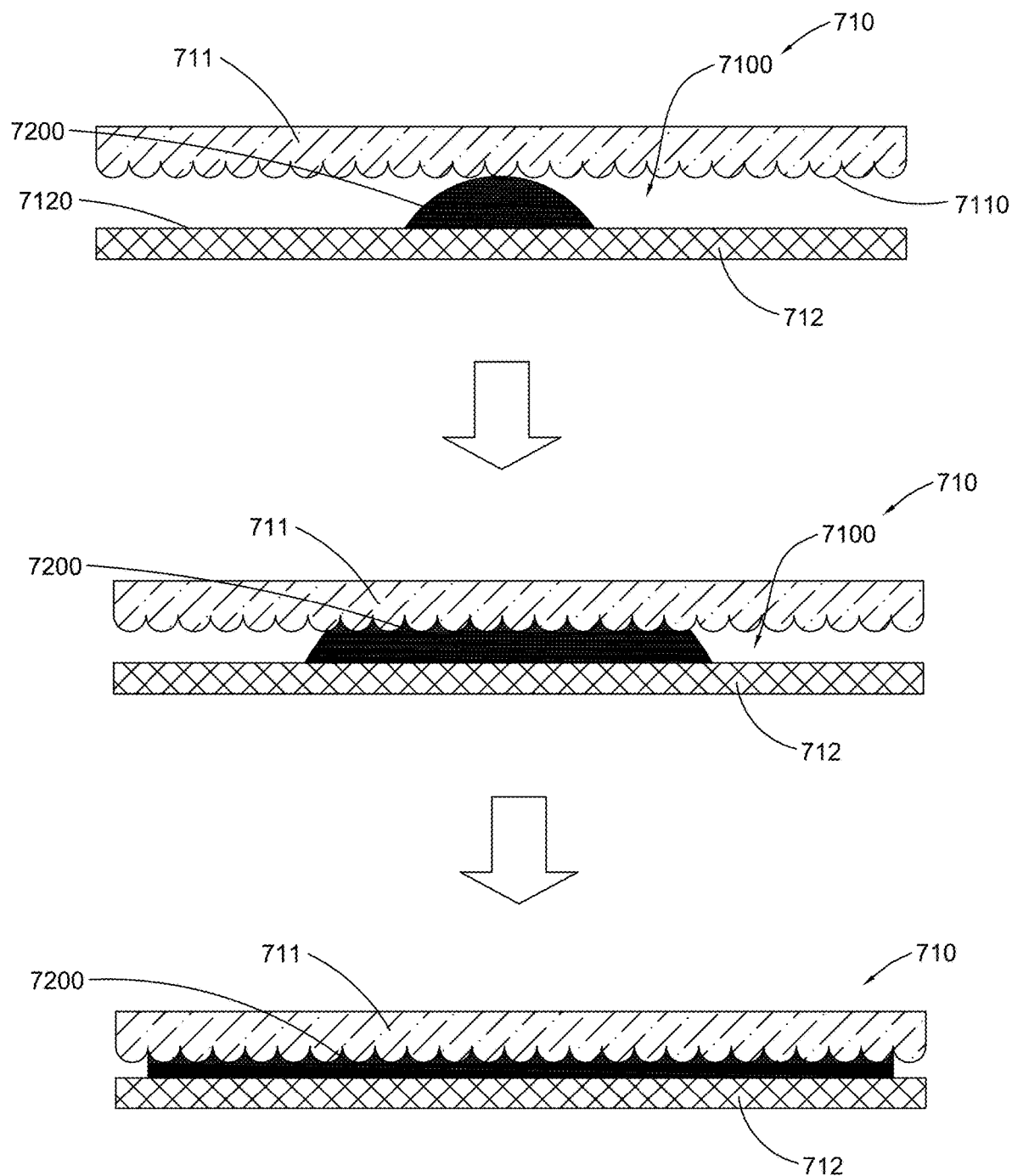
FIG. 19 shows an example of a mold closing step in the manufacturing method of the resin DOE according to the above embodiments of the present invention.

Exemplarily, as shown in FIG. 19, first, the first imprinting surface 7110 of the first mold 711 is disposed toward the second imprinting surface 7120 of the second mold 712 with their centers aligned with each other, and the first imprinting surface 7110 of the first mold 711 and the second imprinting surface 7120 of the second mold 712 are parallel to each other; then, the first mold 711 is operated to gradually reduce the spacing between the first imprinting surface 7110 of the first mold 711 and the second imprinting surface 7120 of the second mold 712, at this time, the liquid resin material 7200 will spread outwards from the center in the space 7100 between the first imprinting surface 7110 of the first mold 711 and the second imprinting surface 7120 of the second mold 712; finally, when the first imprinting surface 7110 of the first mold 711 contacts the liquid resin material 7200 on the second imprinting surface 7120 of the second mold 712, the spacing between the first imprinting surface 7110 of the first mold 711 and the second imprinting surface 7120 of the second mold 712 is further gradually reduced, until a preset distance is reached. At the same time, the liquid resin material 7200 is pressed to spreadingly fill the space 7100 outwardly from the center between the first imprinting surface 7110 of the first mold 711 and the second imprinting surface 7120 of the second mold 712.

Preferably, the liquid resin material 7200 does not spread beyond the second imprinting surface 7120 of the second mold 712, and the first imprinting surface 7110 of the first mold 711 is always parallel to the second imprinting surface 7120 of the second mold 712 in the process of spacing reduction, so as to ensure that the liquid resin material 7200 is subjected to a homogeneous pressing force, and then evenly spreads outwards from the center to evenly fill the space 7100 of the manufacturing apparatus 710.

It can be understood that the preset distance in the present invention can be preset according to the required thickness of the resin DOE 720, so as to manufacture a finished DOE with a thickness meeting the requirement.

It is worth noting that since the liquid resin material 7200 is implemented as a light-curable liquid resin adhesive, it needs to be cured under the condition of light irradiation to form the resin DOE 720, so the first mold 711 and/or the second mold 712 of the manufacturing apparatus 710 according to the present invention need to be made of a light-transmitting material such as quartz or glass, so that when the first mold 711 and the second mold 712 of the manufacturing apparatus 710 are in the mold closed state, the light emitted by an external light source can pass through the first mold 711 and/or the second mold 712 to irradiate the liquid resin material 7200, to allow the liquid resin material 7200 to be cured under the condition of light irradiation to form the resin DOE720.

Preferably, the first mold 711 of the manufacturing apparatus 710 is made of a light-transmitting material, so as to allow the light emitted by the external light source to irradiate on a side of the liquid resin material 7200 facing towards the first imprinting surface 7110 of the first mold 711 first after the light passes through the first mold 711; and then irradiate on a side of the liquid resin material 7200 facing towards the second imprinting surface 7120 of the second mold 712, to allow the side of the liquid resin material 7200 facing towards the first imprinting surface 7110 of the first mold 711 to be subjected to the light irradiation first to be cured to form the microstructured layer 721 of the resin DOE 720, so as to prevent the side of the liquid resin material 7200 facing towards the second imprinting surface 7120 from being irradiated to be cured and form the flat substrate layer 722 of the resin DOE 720 first and adversely affecting the curing and forming quality of the microstructured layer 721 accordingly, thereby facilitating the improvement of the imprinted quality of the microstructured layer 721 of the resin DOE72 0.

Figure 20:
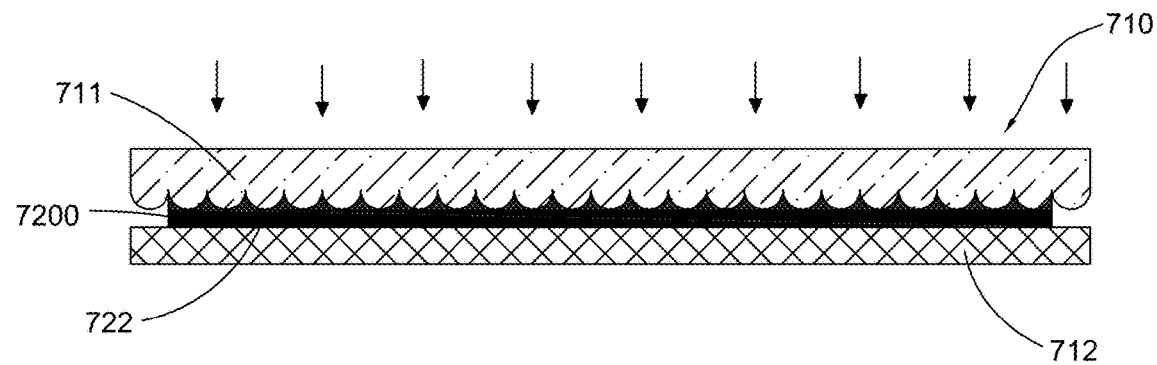
FIG. 20 shows an example of a curing step in the manufacturing method of the resin DOE according to the above embodiments of the present invention.

Exemplarily, as shown in FIG. 20, in the step S130 of the manufacturing method of the resin DOE of the present invention: light irradiation treatment is performed on the resin material 7200 through the first mold 711, and after the specified dose is reached, the light irradiation (or exposure) is stopped, to allow the liquid resin material 7200 to be light-cured to form the resin DOE 720 with an integrally formed structure.

Figure 21:
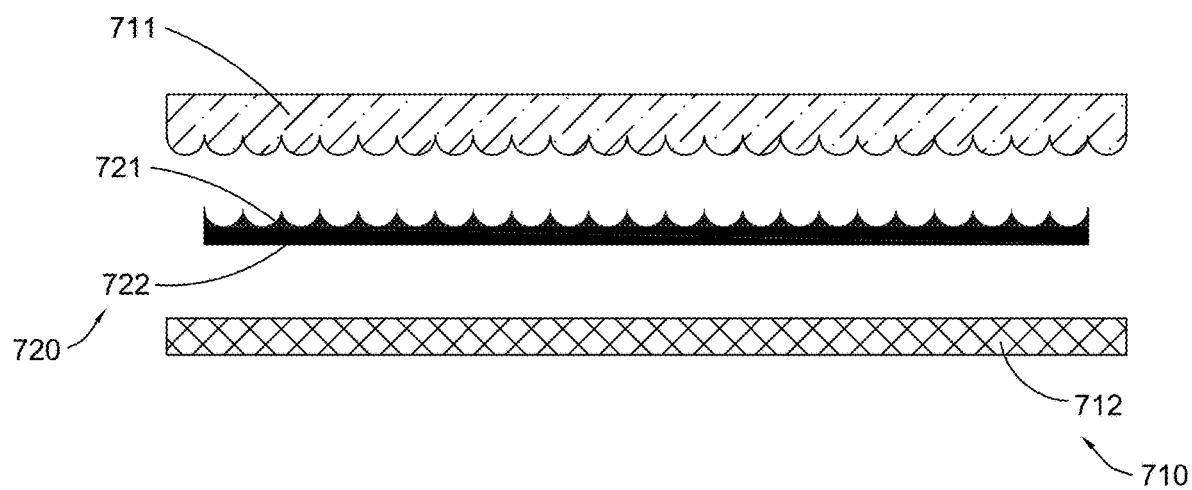
FIG. 21 shows an example of a mold opening step in the manufacturing method of the resin DOE according to the above embodiments of the present invention.

According to the above embodiments of the present invention, in the step S140 of the manufacturing method of the resin DOE: as shown in FIG. 21, the mold opening operation is performed on the first mold 711 and the second mold 712 of the manufacturing apparatus 710 to expose the resin DOE 720 to take out the resin DOE 720 as a finished DOE manufactured by the present invention. In other words, the first mold 711, the resin DOE 720 and the second mold 712 are separated, the first mold 711 and the second mold 712 can be reused, and the separated resin DOE 720 is just the required DOE finished product. It can be understood that precisely because the manufacturing apparatus 710 of the present invention adopts the integrated micro-nano imprinting technology, it has good compatibility with the original nano-imprinting process, and can share the imprinting mold (that is, the first mold 711, which facilitates reduction of the manufacturing cost, so that the overall cost of the resin DOE 720 in the present invention is lower than the cost of imprinting on glass.

It is worth mentioning that, according to another aspect of the present invention, a manufacturing apparatus 710 is further provided according to an embodiment of the present invention, for manufacturing a resin DOE 720 from a liquid resin material 7200. Specifically, as shown in FIG. 19 and FIG. 22, the manufacturing apparatus 710 includes at least one first mold 711 and at least one second mold 712, where the first mold 711 has a first imprinting surface 7110, and the second mold 712 has a second imprinting surface 7120, where the first mold 711 and/or the second mold 712 can be operated such that the manufacturing apparatus 710 is switched between a mold closed state and a mold opened state, and when the manufacturing apparatus 710 is switched from the mold opened state to the mold closed state, the spacing between the first imprinting surface 7110 of the first mold 711 and the second imprinting surface 7120 of the second mold 712 is reduced, for pressing the liquid resin material 7200 to spread in the space 7100 between the first imprinting surface 7110 of the first mold 711 and the second imprinting surface 7120 of the second mold 712 to fill the space 7100, and form the resin DOE 720 after the liquid resin material 7200 is cured; and when the manufacturing apparatus 710 is switched from the mold closed state to the mold opened state, the spacing between the first imprinting surface 7110 of the first mold 711 and the second imprinting surface 7120 of the second mold 712 will become large for taking out the resin DOE 720 as a finished DOE.

Figures 22, 23:
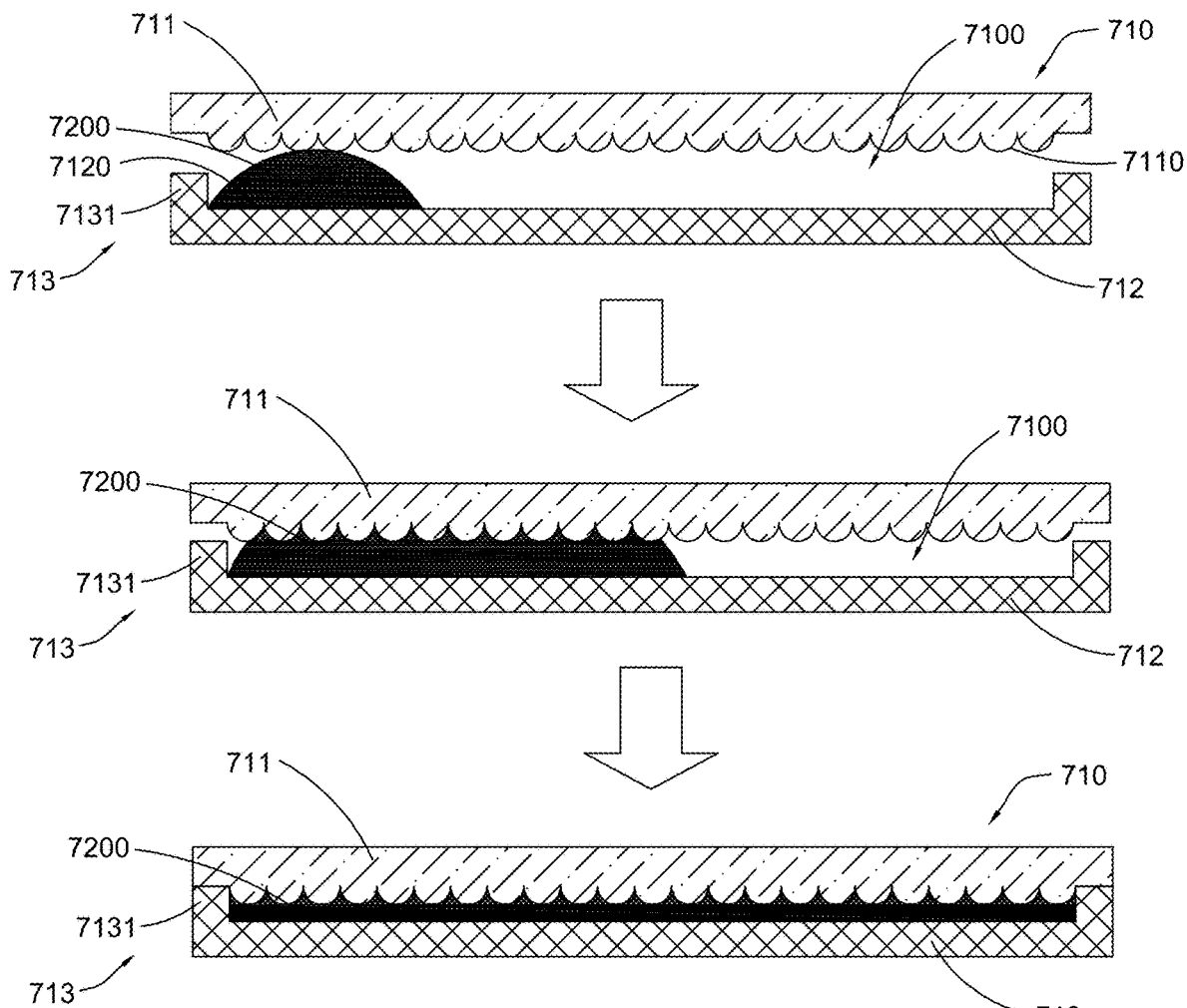
FIG. 22 shows a variant example of a manufacturing apparatus in the manufacturing method of the resin DOE according to the above embodiments of the present invention.
FIG. 23 shows a schematic block diagram of a manufacturing system of a resin DOE in the manufacturing apparatus according to the above embodiments of the present invention.

More specifically, as shown in FIG. 22, the manufacturing apparatus 710 of the present invention may further include a spill prevention mechanism 713, where the spill prevention mechanism 713 is arranged between the first mold 711 and the second mold 712, and when the manufacturing apparatus 710 is in the mold closed state, the spill prevention mechanism 713 surrounds the second imprinting surface 7120 of the second mold 712 and the first imprinting surface 7110 of the first mold 711, for blocking the liquid resin material 7200 from spreading to regions beyond the first imprinting surface 7110 and the second imprinting surface 7120.

Exemplarily, as shown in FIG. 22, the spill prevention mechanism 713 of the manufacturing apparatus 710 may include an annular spill prevention member 7131, specifically, the annular spill prevention member 7131 extends convexly from the second imprinting surface 7120 of the second mold 712, and the annular spill prevention member 7131 surrounds the second imprinting surface 7120 to form a recess with the second imprinting surface 7120 as a bottom surface, so that the liquid resin material 7200, when being pressed, will spread in the recess and will not spread to a region beyond the second imprinting surface 7120.

Apparently, in other examples of the present invention, one part of the annular spill prevention member 7131 may extend convexly from the second imprinting surface 7120 of the second mold 712, while another part of the annular spill prevention member 7131 may extend convexly from the first imprinting surface 7110 of the first mold 711, and when the manufacturing apparatus 710 is in a mold closed state, the two parts of the annular spill prevention member 7131 cooperate with each other to form the complete annular spill prevention member 7131, so as to ensure that the annular spill prevention member 7131 prevents the liquid resin material 7200 from spreading to the region beyond the second imprinting surface 7120, and further facilitate the taking out of the resin DOE 720 when the manufacturing apparatus 710 is in the mold opened state. For example, the two parts of the annular spill prevention member 7131 are implemented as mutually mating C-shaped bosses.

Preferably, the height of the annular spill prevention member 7131 is equal to the preset distance, so that when the first imprinting surface 7110 of the first mold 711 completely contacts a top surface of the annular spill prevention member 7131, the spacing between the first imprinting surface 7110 of the first mold 711 and the second imprinting surface 7120 of the second mold 712 is exactly equal to the preset distance, and in this case, the liquid resin material 7200, after being cured, will form the resin DOE 720 with a thickness of the preset distance.

It is worth noting that, as shown in FIG. 22, when the manufacturing apparatus 710 is provided with the spill prevention mechanism 713, the step S110 of the manufacturing method of the resin DOE is not required to limit the specific region 7101 to the central region of the second imprinting surface 7120 of the second mold 712, instead, the specific region 7101 may be arranged on the edge region of the second imprinting surface 7120 of the second mold 712, so that the liquid resin material 7200 is pressed to spread from the edge region to the center under the barrier of the spill prevention mechanism 713. In particular, in the step S122 of the present invention, there is no need to gradually reduce the spacing between the first imprinting surface 7110 of the first mold 711 and the second imprinting surface 7120 of the second mold 712 while keeping the first imprinting surface 7110 of the first mold 711 and the second imprinting surface 7120 of the second mold 712 in parallel with each other. Instead, the specific region 7101 can be used as a pivot region to pivotally reduce the spacing between the first imprinting surface 7110 of the first mold 711 and the second imprinting surface 7120 of the second mold 712, to allow the liquid resin material 7200 to spread from the edge to the center to fill the space 7100 between the first imprinting surface 7110 of the first mold 711 and the second imprinting surface 7120 of the second mold 712, which is not described in detail further in the present invention.

According to the above embodiments of the present invention, as shown in FIG. 23, the manufacturing apparatus 710 may further include a manufacturing system 714 of a resin DOE. Specifically, the manufacturing system 714 of the resin DOE may include a material placement module 7141, a mold closing module 7142, a curing module 7143 and a mold opening module 7144. Specifically, the material placement module 7141 is configured to place the liquid resin material on a first imprinting surface 7110 of a first mold 711 and/or a second imprinting surface 7120 of a second mold 712 of a manufacturing apparatus 710; the mold closing module 7142 is configured to operate the first mold 711 and/or the second mold 712 of the manufacturing apparatus 710 by mold closing, for nano-imprinting the liquid resin material 7200, so that the liquid resin material 7200 is pressed to spread in a space 7100 between the first imprinting surface 7110 of the first mold 711 and the second imprinting surface 7120 of the second mold 712 in a filling manner. The curing module 7143 is configured to perform an operation of curing on the liquid resin material 7200, to allow the liquid resin material 7200 to form a resin DOE720 with an integrally formed structure after being cured. The mold opening module 7144 is configured to operate the first mold 711 and/or the second mold 712 of the manufacturing apparatus 710 by mold opening, to take out the resin DOE720 as a finished DOE.

According to another aspect of the present invention, as shown in FIG. 7, a resin DOE720 is further provided according to the present invention, where the resin DOE720 includes at least one microstructured layer 721 and a substrate layer 722 integrally connected to the microstructured layer 721, and the microstructured layer 721 and the substrate layer 722 of the resin DOE 720 are manufactured by integrally nanoimprinting liquid resin material and then curing.

More specifically, the method for manufacturing the resin DOE 720 may include steps of: placing a liquid resin material on a first imprinting surface 7110 of a first mold 711 and/or a second imprinted surface 7120 of a second mold 712 of a manufacturing apparatus 710; nano-imprinting the liquid resin material 7200 by operating the first mold 711 and/or the second mold 712 of the manufacturing apparatus 710 in a mold closing manner, so that the liquid resin material 7200 is pressed to spread in the space 7100 between the first imprinting surface 7110 of the first mold 711 and the second imprinting surface 7120 of the second mold 712 in a filling manner; performing an operation of curing on the liquid resin material 7200 to allow the liquid resin material 7200 to form a resin DOE 720 with an integrally formed structure after the liquid resin material 7200 is cured; and taking out the resin DOE 720 as a finished DOE by operating the first mold 711 and/or the second mold 712 in a mold opening manner.

It is to be understood by the person skilled in the art that the embodiments of the present invention shown in the foregoing description and drawings are only examples and do not limit the present invention. The objects of the present invention have been fully and effectively accomplished. The functions and structural principles of the present invention have been shown and described in the embodiments, and the embodiments of the present invention may have any variations or modifications without departing from the principles.

What is claimed is:

1. A manufacturing method for an integrally formed resin diffusing component, comprising:

step A, arranging a preset amount of a light-curable resin material in a liquid state on at least one flat supporting surface;

step B, relatively reducing a spacing between a mold and a flat supporting surface of the at least one flat supporting surface until reaching a preset distance, wherein the mold has at least one microstructured surface for forming a microlens layer of the diffusing component, and the resin material is located between a microstructured surface of the at least one microstructured surface and the flat supporting surface, at the preset distance, the resin material in the liquid state is spread between the microstructured surface and the flat supporting surface and has a spread area, wherein the microstructured surface of the mold is imprinted on a surface of the resin material to form the microlens layer;

step C, performing a light-curing treatment on the resin material in the liquid state to obtain a light-cured resin material as the diffusing component; and step D, removing the light-cured resin material from between the mold and the flat supporting surface;

wherein the microlens layer is a microlens array composed of a group of stochastically arranged microlens units, wherein part of parameters of the microlens units are different, to prevent light from producing interference fringes when light passes through the diffusing component and propagates in space;

wherein a design method of the microstructured surface of the mold and the microlens array of the diffusing component corresponding to the microstructured surface comprises:

marking off regions where the microlens units are located respectively on a surface of a substrate, cross-sectional shapes or sizes of the regions where the microlens units are located respectively are basically consistent;

establishing a global coordinate system (X, Y, Z) for the microlens array, and establishing a local coordinate system $(x_i, y_i, z_i)$ for a microlens unit, and a central coordinate of a region corresponding the local coordinate system is $(x_0, y_0, z_0)$, where the central coordinate of the region represent an initial central position of the microlens unit;

setting a real center position of the microlens unit to be a position obtained by adding a random offset $X_{Offset}$, and a random offset $Y_{Offset}$ to central coordinate of the region in an X-axis direction and a Y-axis direction respectively; and representing a surface profile of the microlens unit in an Z-axis direction by a camber function f:

$$f = \frac{cr^2}{1+\sqrt{1-(1+k)c^2r^2}} + \sum_{i=1}^{N} A_i E_i(x_i - x_0 - X_{Offset}, y_i - y_0 - Y_{Offset}) + Z_{offset}$$

wherein, $r^2 = (x_i - x_0 - X_{Offset})^2 + (y_i - y_0 - Y_{Offset})^2$, is the curvature of the microlens unit, k is a conic constant, Ai is a coefficient of an i-th extended polynomial, and $Z_{Offset}$ is an offset in the Z-axis direction corresponding to the microlens unit.

2. The manufacturing method for the diffusing component according to claim 1, wherein in the step B, the mold is kept relatively parallel to the flat supporting surface.

3. The manufacturing method for the diffusing component according to claim 2, wherein the step B comprises step B1, relatively reducing a spacing between the mold and the flat supporting surface until a position is reached in which the microstructured surface of the mold contacts the resin material; and step B2, continuing to relatively reduce the spacing between the mold and the flat supporting surface until the preset distance is reached, wherein the resin material in the liquid state gradually spreads between the microstructured surface and the flat supporting surface, wherein in the step B1 and the step B2, the mold is always kept relatively parallel to the flat supporting surface.

4. The manufacturing method for the diffusing component according to claim 3, wherein at the preset distance, the spread area of the resin material in the liquid state does not exceed an area of the flat supporting surface.

5. The manufacturing method for the diffusing component according to claim 1, wherein in the step A, the resin material in the liquid state is dispensed on the flat supporting surface.

6. The manufacturing method for the diffusing component according to claim 5, wherein in the step A, the resin material is located at a center position of the flat supporting surface.

7. The manufacturing method for the diffusing component according to claim 6, wherein at the preset distance, the spread area of the liquid resin material does not exceed an area of the flat supporting surface.

8. The manufacturing method for the diffusing component according to claim 1, wherein the flat supporting surface is provided by a supporting plate.

9. The manufacturing method for the diffusing component according to claim 1, wherein in the step A, at least two resin materials are arranged on the flat supporting surface and are spaced apart.

10. The manufacturing method for the diffusing component according to claim 9, wherein in the step B, the mold has at least two microstructured surfaces respectively corresponding to the at least two resin materials.

11. The manufacturing method for the diffusing component according to claim 10, wherein in the step B, the at least two microstructured surfaces are located in different planes, wherein the spacings between the flat supporting surface and each of the at least two microstructured surfaces are all different, to manufacture diffusing components with different thicknesses.

12. The manufacturing method for the diffusing component according to claim 1, wherein in the step A, at least two resin materials are separately arranged on corresponding at least two flat supporting surfaces.

13. The manufacturing method for the diffusing component according to claim 12, wherein the at least two flat supporting surfaces are in different planes, and the spacings between the microstructured surface and the flat supporting surfaces are different, to manufacture diffusing components with different thicknesses.

14. The manufacturing method for the diffusing component according to claim 1, wherein the resin material is a resin adhesive.

* * * * *